United States Patent
Uzoh

(10) Patent No.: US 12,027,487 B2
(45) Date of Patent: Jul. 2, 2024

(54) STRUCTURES FOR LOW TEMPERATURE BONDING USING NANOPARTICLES

(71) Applicant: ADEIA SEMICONDUCTOR TECHNOLOGIES LLC, San Jose, CA (US)

(72) Inventor: Cyprian Emeka Uzoh, San Jose, CA (US)

(73) Assignee: Adeia Semiconductor Technologies LLC, San Jose, CA (US)

(*) Notice: Subject to any disclaimer, the term of this patent is extended or adjusted under 35 U.S.C. 154(b) by 7 days.

(21) Appl. No.: 18/145,310

(22) Filed: Dec. 22, 2022

(65) Prior Publication Data

US 2023/0335531 A1 Oct. 19, 2023

Related U.S. Application Data

(60) Continuation of application No. 17/140,519, filed on Jan. 4, 2021, now Pat. No. 11,710,718, which is a (Continued)

(51) Int. Cl.
*H01L 23/538* (2006.01)
*H01L 23/00* (2006.01)
(Continued)

(52) U.S. Cl.
CPC ............ *H01L 24/81* (2013.01); *H01L 24/11* (2013.01); *H01L 24/13* (2013.01); *H01L 24/16* (2013.01);
(Continued)

(58) Field of Classification Search
None
See application file for complete search history.

(56) References Cited

U.S. PATENT DOCUMENTS 3,214,827 A 11/1965 Phohofsky
3,766,439 A 10/1973 Isaacson
(Continued)

FOREIGN PATENT DOCUMENTS

CN 1942057 A 4/2007
CN 101002313 A 7/2007
(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.
(Continued)

*Primary Examiner* — Benjamin P Sandvik
(74) *Attorney, Agent, or Firm* — Knobbe Martens Olson & Bear LLP

(57) ABSTRACT

A method of making an assembly can include juxtaposing a top surface of a first electrically conductive element at a first surface of a first substrate with a top surface of a second electrically conductive element at a major surface of a second substrate. One of: the top surface of the first conductive element can be recessed below the first surface, or the top surface of the second conductive element can be recessed below the major surface. Electrically conductive nanoparticles can be disposed between the top surfaces of the first and second conductive elements. The conductive nanoparticles can have long dimensions smaller than 100 nanometers. The method can also include elevating a temperature at least at interfaces of the juxtaposed first and second conductive elements to a joining temperature at which the conductive nanoparticles can cause metallurgical joints to form between the juxtaposed first and second conductive elements.

17 Claims, 9 Drawing Sheets

Related U.S. Application Data continuation of application No. 16/740,670, filed on Jan. 13, 2020, now Pat. No. 10,892,246, which is a continuation of application No. 15/937,149, filed on Mar. 27, 2018, now Pat. No. 10,535,626, which is a division of application No. 15/336,192, filed on Oct. 27, 2016, now Pat. No. 10,886,250.

(51) Int. Cl.
*H01L 25/00* (2006.01)
*H01L 25/065* (2023.01)

(52) U.S. Cl.
CPC .............. *H01L 24/17* (2013.01); *H01L 24/80* (2013.01); *H01L 24/83* (2013.01); *H01L 25/0657* (2013.01); *H01L 25/50* (2013.01); *H01L 2224/03009* (2013.01); *H01L 2224/0401* (2013.01); *H01L 2224/05571* (2013.01); *H01L 2224/05572* (2013.01); *H01L 2224/05605* (2013.01); *H01L 2224/05609* (2013.01); *H01L 2224/05611* (2013.01); *H01L 2224/05616* (2013.01); *H01L 2224/05639* (2013.01); *H01L 2224/05644* (2013.01); *H01L 2224/05684* (2013.01); *H01L 2224/11009* (2013.01); *H01L 2224/11464* (2013.01); *H01L 2224/13018* (2013.01); *H01L 2224/13019* (2013.01); *H01L 2224/13084* (2013.01); *H01L 2224/13562* (2013.01); *H01L 2224/13564* (2013.01); *H01L 2224/13655* (2013.01); *H01L 2224/13684* (2013.01); *H01L 2224/13686* (2013.01); *H01L 2224/13805* (2013.01); *H01L 2224/13809* (2013.01); *H01L 2224/13811* (2013.01); *H01L 2224/13844* (2013.01); *H01L 2224/13847* (2013.01); *H01L 2224/13855* (2013.01); *H01L 2224/16148* (2013.01); *H01L 2224/16238* (2013.01); *H01L 2224/16265* (2013.01); *H01L 2224/16268* (2013.01); *H01L 2224/16501* (2013.01); *H01L 2224/2919* (2013.01); *H01L 2224/80357* (2013.01); *H01L 2224/80895* (2013.01); *H01L 2224/80896* (2013.01); *H01L 2224/81026* (2013.01); *H01L 2224/81065* (2013.01); *H01L 2224/81099* (2013.01); *H01L 2224/81193* (2013.01); *H01L 2224/8181* (2013.01); *H01L 2224/83026* (2013.01); *H01L 2224/83815* (2013.01); *H01L 2225/06513* (2013.01); *H01L 2924/01013* (2013.01); *H01L 2924/01028* (2013.01); *H01L 2924/01029* (2013.01); *H01L 2924/01031* (2013.01); *H01L 2924/01047* (2013.01); *H01L 2924/01049* (2013.01); *H01L 2924/0105* (2013.01); *H01L 2924/01074* (2013.01); *H01L 2924/01079* (2013.01); *H01L 2924/01082* (2013.01); *H01L 2924/014* (2013.01); *H01L 2924/19041* (2013.01); *H01L 2924/19043* (2013.01); *H01L 2924/19104* (2013.01); *H01L 2924/3841* (2013.01)

(56) References Cited

U.S. PATENT DOCUMENTS

| | | |
|---|---|---|
| 3,775,844 A | 12/1973 | Parks |
| 3,873,889 A | 3/1975 | Leyba |
| 4,225,900 A | 9/1980 | Ciccio et al. |
| 4,567,543 A | 1/1986 | Miniet |
| 4,576,543 A | 3/1986 | Kuchyt et al. |
| 4,695,870 A | 9/1987 | Patraw |
| 4,716,049 A | 12/1987 | Patraw |
| 4,781,601 A | 11/1988 | Kuhl et al. |
| 4,804,132 A | 2/1989 | DiFrancesco |
| 4,818,728 A | 4/1989 | Rai et al. |
| 4,902,600 A | 2/1990 | Tamagawa et al. |
| 4,924,353 A | 5/1990 | Patraw |
| 4,939,568 A | 7/1990 | Kato et al. |
| 4,941,033 A | 7/1990 | Kishida |
| 4,975,079 A | 12/1990 | Beaman et al. |
| 4,982,265 A | 1/1991 | Watanabe et al. |
| 4,991,290 A | 2/1991 | MacKay |
| 4,998,665 A | 3/1991 | Hayashi |
| 5,046,238 A | 9/1991 | Daigle et al. |
| 5,068,714 A | 11/1991 | Seipler |
| 5,083,697 A | 1/1992 | DiFrancesco |
| 5,087,585 A | 2/1992 | Hayashi |
| 5,116,456 A | 5/1992 | Nestor |
| 5,116,459 A | 5/1992 | Kordus et al. |
| 5,117,282 A | 5/1992 | Salatino |
| 5,130,779 A | 7/1992 | Agarwala et al. |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bemardoni et al. |
| 5,189,505 A | 2/1993 | Bartelink |
| 5,196,726 A | 3/1993 | Nishiguchi et al. |
| 5,198,888 A | 3/1993 | Sugano et al. |
| 5,214,308 A | 5/1993 | Nishiguchi et al. |
| 5,220,448 A | 6/1993 | Vogel et al. |
| 5,220,488 A | 6/1993 | Denes |
| 5,222,014 A | 6/1993 | Lin |
| 5,224,023 A | 6/1993 | Smith et al. |
| 5,236,118 A | 8/1993 | Bower et al. |
| 5,247,423 A | 9/1993 | Lin et al. |
| 5,251,806 A | 10/1993 | Agarwala et al. |
| 5,281,852 A | 1/1994 | Normington |
| 5,313,416 A | 5/1994 | Kimura |
| 5,322,593 A | 6/1994 | Hasegawa et al. |
| 5,324,892 A | 6/1994 | Granier et al. |
| 5,334,804 A | 8/1994 | Love et al. |
| 5,334,875 A | 8/1994 | Sugano et al. |
| 5,341,564 A | 8/1994 | Akhavain et al. |
| 5,345,205 A | 9/1994 | Kornrumpf |
| 5,347,159 A | 9/1994 | Khandros et al. |
| 5,390,844 A | 2/1995 | DiStefano et al. |
| 5,394,303 A | 2/1995 | Yamaji |
| 5,397,916 A | 3/1995 | Normington |
| 5,397,997 A | 3/1995 | Tuckerman et al. |
| 5,398,863 A | 3/1995 | Grube et al. |
| 5,409,865 A | 4/1995 | Karnezos |
| 5,413,952 A | 5/1995 | Pages et al. |
| 5,422,435 A | 6/1995 | Takiar et al. |
| 5,426,563 A | 6/1995 | Moresco et al. |
| 5,440,171 A | 8/1995 | Miyano et al. |
| 5,442,235 A | 8/1995 | Parrillo et al. |
| 5,448,511 A | 9/1995 | Paurus et al. |
| 5,454,160 A | 10/1995 | Nickel |
| 5,455,390 A | 10/1995 | DiStefano et al. |
| 5,455,740 A | 10/1995 | Burns |
| 5,457,879 A | 10/1995 | Gurtler et al. |
| 5,466,635 A | 11/1995 | Lynch et al. |
| 5,479,318 A | 12/1995 | Burns |
| 5,489,749 A | 2/1996 | DiStefano et al. |
| 5,489,804 A | 2/1996 | Pasch |
| 5,491,302 A | 2/1996 | DiStefano et al. |
| 5,501,003 A | 3/1996 | Bernstein |
| 5,503,704 A | 4/1996 | Bower et al. |
| 5,516,727 A | 5/1996 | Broom |
| 5,518,964 A | 5/1996 | DiStefano et al. |
| 5,536,909 A | 7/1996 | DiStefano et al. |
| 5,539,153 A | 7/1996 | Schwiebert et al. |
| 5,541,525 A | 7/1996 | Wood et al. |
| 5,552,963 A | 9/1996 | Burns |
| 5,587,342 A | 12/1996 | Lin et al. |
| 5,610,431 A | 3/1997 | Martin |
| 5,615,824 A | 4/1997 | Fjelstad et al. |
| 5,640,052 A | 6/1997 | Tsukamoto |
| 5,646,446 A | 7/1997 | Nicewarner, Jr. et al. |
| 5,656,550 A | 8/1997 | Tsuji et al. |
| 5,659,952 A | 8/1997 | Kovac et al. |

(56) References Cited

U.S. PATENT DOCUMENTS

| | | |
|---|---|---|
| 5,679,977 A | 10/1997 | Khandros et al. |
| 5,689,091 A | 11/1997 | Hamzehdoost et al. |
| 5,696,406 A | 12/1997 | Ueno |
| 5,717,556 A | 2/1998 | Yanagida |
| 5,731,709 A | 3/1998 | Pastore et al. |
| 5,734,199 A | 3/1998 | Kawakita et al. |
| 5,739,585 A | 4/1998 | Akram et al. |
| 5,753,536 A | 5/1998 | Sugiyama et al. |
| 5,762,845 A | 6/1998 | Crumly |
| 5,771,555 A | 6/1998 | Eda et al. |
| 5,776,797 A | 7/1998 | Nicewarner, Jr. et al. |
| 5,777,386 A | 7/1998 | Higashi et al. |
| 5,786,271 A | 7/1998 | Ohida et al. |
| 5,789,815 A | 8/1998 | Tessier et al. |
| 5,798,286 A | 8/1998 | Faraci et al. |
| 5,802,699 A | 9/1998 | Fjelstad et al. |
| 5,805,422 A | 9/1998 | Otake et al. |
| 5,811,982 A | 9/1998 | Beaman et al. |
| 5,821,692 A | 10/1998 | Rogers et al. |
| 5,854,507 A | 12/1998 | Miremadi et al. |
| 5,861,666 A | 1/1999 | Bellaar |
| 5,866,942 A | 2/1999 | Suzuki et al. |
| 5,956,234 A | 9/1999 | Mueller |
| 5,973,391 A | 10/1999 | Bischoff et al. |
| 5,980,270 A | 11/1999 | Fjelstad et al. |
| 5,985,692 A | 11/1999 | Poenisch et al. |
| 5,985,739 A | 11/1999 | Plettner et al. |
| 5,998,808 A | 12/1999 | Matsushita |
| 6,001,671 A | 12/1999 | Fjelstad |
| 6,008,126 A | 12/1999 | Leedy |
| 6,032,359 A | 3/2000 | Carroll |
| 6,052,287 A | 4/2000 | Palmer et al. |
| 6,054,756 A | 4/2000 | DiStefano et al. |
| 6,059,984 A | 5/2000 | Cohen et al. |
| 6,061,245 A | 5/2000 | Ingraham et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,157,075 A | 12/2000 | Karavakis et al. |
| 6,175,159 B1 | 1/2001 | Sasaki et al. |
| 6,177,636 B1 | 1/2001 | Fjelstad et al. |
| 6,202,297 B1 | 3/2001 | Faraci et al. |
| 6,216,941 B1 | 4/2001 | Yokoyama et al. |
| 6,217,972 B1 | 4/2001 | Beroz et al. |
| 6,218,302 B1 | 4/2001 | Braeckelmann et al. |
| 6,229,220 B1 | 5/2001 | Saitoh et al. |
| 6,232,150 B1 | 5/2001 | Lin et al. |
| 6,235,996 B1 | 5/2001 | Farooq et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,300,679 B1 | 10/2001 | Mukerji et al. |
| 6,307,260 B1 | 10/2001 | Smith et al. |
| 6,316,786 B1 | 11/2001 | Mueller et al. |
| 6,322,903 B1 | 11/2001 | Siniaguine et al. |
| 6,326,555 B1 | 12/2001 | McCormack et al. |
| 6,329,594 B1 | 12/2001 | Sturcken |
| 6,330,272 B1 | 12/2001 | Lomp |
| 6,332,270 B2 | 12/2001 | Beaman et al. |
| 6,333,120 B1 | 12/2001 | DeHaven et al. |
| 6,333,206 B1 | 12/2001 | Ito et al. |
| 6,335,571 B1 | 1/2002 | Capote et al. |
| 6,348,709 B1 | 2/2002 | Graettinger et al. |
| 6,358,627 B2 | 3/2002 | Benenati et al. |
| 6,362,525 B1 | 3/2002 | Rahim |
| 6,374,770 B1 | 4/2002 | Lee |
| 6,396,155 B1 | 5/2002 | Nukiwa et al. |
| 6,409,904 B1 | 6/2002 | Uzoh et al. |
| 6,423,640 B1 | 7/2002 | Lee et al. |
| 6,455,785 B1 | 9/2002 | Sakurai et al. |
| 6,458,411 B1 | 10/2002 | Goossen et al. |
| 6,465,892 B1 | 10/2002 | Suga |
| 6,469,394 B1 | 10/2002 | Wong et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,528,894 B1 | 3/2003 | Akram et al. |
| 6,545,228 B2 | 4/2003 | Hashimoto |
| 6,550,666 B2 | 4/2003 | Chew et al. |
| 6,552,436 B2 | 4/2003 | Burnette et al. |
| 6,555,917 B1 | 4/2003 | Heo |
| 6,555,918 B2 | 4/2003 | Masuda et al. |
| 6,560,117 B2 | 5/2003 | Moon |
| 6,578,754 B1 | 6/2003 | Tung |
| 6,579,744 B1 | 6/2003 | Jiang |
| 6,583,515 B1 | 6/2003 | James et al. |
| 6,589,813 B1 | 7/2003 | Park |
| 6,589,870 B1 | 7/2003 | Katoh et al. |
| 6,592,109 B2 | 7/2003 | Yamaguchi et al. |
| 6,600,224 B1 | 7/2003 | Farquhar et al. |
| 6,624,003 B1 | 9/2003 | Rice |
| 6,624,653 B1 | 9/2003 | Cram |
| 6,627,814 B1 | 9/2003 | Stark |
| 6,632,377 B1 | 10/2003 | Brusic et al. |
| 6,647,310 B1 | 11/2003 | Yi et al. |
| 6,648,213 B1 | 11/2003 | Patterson et al. |
| 6,660,564 B2 | 12/2003 | Brady |
| 6,664,637 B2 | 12/2003 | Jimarez et al. |
| 6,667,225 B2 | 12/2003 | Hau-Riege et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Iijima et al. |
| 6,815,252 B2 | 11/2004 | Pendse |
| 6,822,336 B2 | 11/2004 | Kurita |
| 6,828,686 B2 | 12/2004 | Park |
| 6,837,979 B2 | 1/2005 | Uzoh et al. |
| 6,852,564 B2 | 2/2005 | Ohuchi et al. |
| 6,864,585 B2 | 3/2005 | Enquist |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,887,769 B2 | 5/2005 | Kellar et al. |
| 6,888,255 B2 | 5/2005 | Murtuza et al. |
| 6,902,869 B2 | 6/2005 | Appelt et al. |
| 6,902,987 B1 | 6/2005 | Tong et al. |
| 6,906,418 B2 | 6/2005 | Hiatt et al. |
| 6,908,027 B2 | 6/2005 | Tolchinsky et al. |
| 6,909,194 B2 | 6/2005 | Farnworth et al. |
| 6,956,165 B1 | 10/2005 | Hata et al. |
| 6,962,835 B2 | 11/2005 | Tong et al. |
| 6,965,166 B2 | 11/2005 | Hikita et al. |
| 6,974,769 B2 | 12/2005 | Basol et al. |
| 6,992,379 B2 | 1/2006 | Alcoe et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,115,495 B2 | 10/2006 | Wark et al. |
| 7,125,789 B2 | 10/2006 | Tellkamp et al. |
| 7,126,212 B2 | 10/2006 | Enquist et al. |
| 7,176,043 B2 | 2/2007 | Haba et al. |
| 7,183,190 B2 | 2/2007 | Saijo et al. |
| 7,193,423 B1 | 3/2007 | Dalton et al. |
| 7,214,887 B2 | 5/2007 | Higashida et al. |
| 7,238,919 B2 | 7/2007 | Kaneko et al. |
| 7,247,508 B2 | 7/2007 | Higashitani et al. |
| 7,354,798 B2 | 4/2008 | Pogge et al. |
| 7,361,285 B2 | 4/2008 | Kim |
| 7,382,049 B2 | 6/2008 | Ho et al. |
| 7,449,099 B1 | 11/2008 | Mayer et al. |
| 7,485,968 B2 | 2/2009 | Enquist et al. |
| 7,569,935 B1 | 8/2009 | Fan |
| 7,598,613 B2 | 10/2009 | Tanida et al. |
| 7,745,943 B2 | 6/2010 | Haba et al. |

(56) References Cited

U.S. PATENT DOCUMENTS

| | | |
|---|---|---|
| 7,750,488 B2 | 7/2010 | Patti et al. |
| 7,803,693 B2 | 9/2010 | Trezza |
| 7,829,265 B2 | 11/2010 | Kitada et al. |
| 7,901,989 B2 | 3/2011 | Haba et al. |
| 7,911,805 B2 | 3/2011 | Haba |
| 7,998,335 B2 | 8/2011 | Feeney et al. |
| 8,039,966 B2 | 10/2011 | Yang et al. |
| 8,115,310 B2 | 2/2012 | Masumoto et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,580,607 B2 | 11/2013 | Haba |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,093,350 B2 | 7/2015 | Endo et al. |
| 9,142,517 B2 | 9/2015 | Liu et al. |
| 9,147,650 B2 * | 9/2015 | Hagimoto ......... H01L 21/76843 |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,262,963 B2 | 4/2019 | Enquist |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,314,175 B2 | 6/2019 | Sato et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,535,626 B2 | 1/2020 | Uzoh et al. |
| 10,707,087 B2 | 7/2020 | Uzoh et al. |
| 10,721,822 B2 | 7/2020 | Sato et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,886,250 B2 | 1/2021 | Uzoh |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,710,718 B2 | 7/2023 | Uzoh |
| 2001/0008309 A1 | 7/2001 | Iijima et al. |
| 2001/0030061 A1 | 10/2001 | Yoneda |
| 2002/0000328 A1 | 1/2002 | Motomura et al. |
| 2002/0003307 A1 | 1/2002 | Suga |
| 2002/0025665 A1 | 2/2002 | Juengling |
| 2002/0033412 A1 | 3/2002 | Tung |
| 2002/0056906 A1 | 5/2002 | Kajiwara et al. |
| 2002/0074641 A1 | 6/2002 | Towle et al. |
| 2002/0074670 A1 | 6/2002 | Suga |
| 2002/0090756 A1 | 7/2002 | Tago et al. |
| 2002/0094661 A1 | 7/2002 | Enquist et al. |
| 2002/0125571 A1 | 9/2002 | Corisis et al. |
| 2002/0153602 A1 | 10/2002 | Tay et al. |
| 2002/0155661 A1 | 10/2002 | Massingill et al. |
| 2002/0185735 A1 | 12/2002 | Sakurai et al. |
| 2002/0190107 A1 | 12/2002 | Shah et al. |
| 2003/0001286 A1 | 1/2003 | Kajiwara et al. |
| 2003/0019568 A1 | 1/2003 | Liu et al. |
| 2003/0075791 A1 | 4/2003 | Shibata |
| 2003/0082846 A1 | 5/2003 | Yoneda et al. |
| 2003/0092220 A1 | 5/2003 | Akram |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |

(56) References Cited

U.S. PATENT DOCUMENTS

| | | |
|---|---|---|
| 2003/0157748 A1 | 8/2003 | Kim et al. |
| 2003/0164540 A1 | 9/2003 | Lee et al. |
| 2003/0189260 A1 | 10/2003 | Tong et al. |
| 2003/0196833 A1 | 10/2003 | Fujii et al. |
| 2003/0234453 A1 | 12/2003 | Liu et al. |
| 2004/0031972 A1 | 2/2004 | Pflughaupt et al. |
| 2004/0084414 A1 | 5/2004 | Sakai et al. |
| 2004/0087057 A1 | 5/2004 | Wang et al. |
| 2004/0126927 A1 | 7/2004 | Lin et al. |
| 2004/0132533 A1 | 7/2004 | Leifer |
| 2004/0135243 A1 | 7/2004 | Aoyagi |
| 2004/0155358 A1 | 8/2004 | Iijima et al. |
| 2004/0173900 A1 | 9/2004 | Chen et al. |
| 2004/0201096 A1 | 10/2004 | Iijima et al. |
| 2004/0224441 A1 | 11/2004 | Saito |
| 2004/0232533 A1 | 11/2004 | Hatakeyama |
| 2004/0235603 A1 | 11/2004 | Peck |
| 2004/0238936 A1 | 12/2004 | Rumer et al. |
| 2004/0245213 A1 | 12/2004 | Fukase et al. |
| 2004/0262778 A1 | 12/2004 | Hua |
| 2005/0093164 A1 | 5/2005 | Standing |
| 2005/0097727 A1 | 5/2005 | Iijima et al. |
| 2005/0101136 A1 | 5/2005 | Mori |
| 2005/0116326 A1 | 6/2005 | Haba et al. |
| 2005/0121784 A1 | 6/2005 | Standing |
| 2005/0124091 A1 | 6/2005 | Fukase et al. |
| 2005/0133572 A1 | 6/2005 | Brese et al. |
| 2005/0150684 A1 | 7/2005 | Hashimoto |
| 2005/0194695 A1 | 9/2005 | Lin et al. |
| 2005/0266670 A1 | 12/2005 | Lin et al. |
| 2005/0274227 A1 | 12/2005 | Aggarwal et al. |
| 2005/0284658 A1 | 12/2005 | Kubota et al. |
| 2005/0285246 A1 | 12/2005 | Haba et al. |
| 2006/0024950 A1 | 2/2006 | Choi et al. |
| 2006/0055032 A1 | 3/2006 | Chang et al. |
| 2006/0057945 A1 | 3/2006 | Hsu et al. |
| 2006/0091538 A1 | 5/2006 | Kabadi |
| 2006/0138647 A1 | 6/2006 | Crisp et al. |
| 2006/0220259 A1 | 10/2006 | Chen et al. |
| 2006/0254502 A1 | 11/2006 | Garrou et al. |
| 2007/0017090 A1 | 1/2007 | Sakai et al. |
| 2007/0045869 A1 | 3/2007 | Ho et al. |
| 2007/0096294 A1 | 5/2007 | Ikeda et al. |
| 2007/0111386 A1 | 5/2007 | Kim et al. |
| 2007/0138649 A1 | 6/2007 | Knights |
| 2007/0141750 A1 | 6/2007 | Iwasaki et al. |
| 2007/0164447 A1 | 7/2007 | Ho et al. |
| 2007/0173900 A1 | 7/2007 | Siegel et al. |
| 2007/0209199 A1 | 9/2007 | Iijima et al. |
| 2007/0216012 A1 | 9/2007 | Hozoji et al. |
| 2007/0230153 A1 | 10/2007 | Tanida et al. |
| 2007/0232023 A1 | 10/2007 | Tong et al. |
| 2007/0292988 A1 | 12/2007 | Nakabayashi |
| 2008/0003402 A1 | 1/2008 | Haba et al. |
| 2008/0067661 A1 | 3/2008 | Kawabata |
| 2008/0073795 A1 | 3/2008 | Kohl et al. |
| 2008/0122092 A1 | 5/2008 | Hong |
| 2008/0138961 A1 | 6/2008 | Lee |
| 2008/0145607 A1 | 6/2008 | Kajiwara et al. |
| 2008/0220373 A1 | 9/2008 | Choi et al. |
| 2008/0237053 A1 | 10/2008 | Andricacos et al. |
| 2008/0251940 A1 | 10/2008 | Lee et al. |
| 2008/0258299 A1 | 10/2008 | Kang et al. |
| 2008/0268570 A1 | 10/2008 | Shen et al. |
| 2009/0002964 A1 | 1/2009 | Haba |
| 2009/0039507 A1 | 2/2009 | Funaki |
| 2009/0039528 A1 | 2/2009 | Haba et al. |
| 2009/0071707 A1 | 3/2009 | Endo et al. |
| 2009/0071837 A1 | 3/2009 | Fredenberg et al. |
| 2009/0091024 A1 | 4/2009 | Zeng et al. |
| 2009/0115047 A1 | 5/2009 | Haba et al. |
| 2009/0121348 A1 | 5/2009 | Chang |
| 2009/0146303 A1 | 6/2009 | Kwon |
| 2009/0148594 A1 | 6/2009 | Moran et al. |
| 2009/0188706 A1 | 7/2009 | Endo |
| 2009/0197408 A1 | 8/2009 | Lehr et al. |
| 2009/0200668 A1 | 8/2009 | Yang et al. |
| 2009/0243095 A1 | 10/2009 | Fujita et al. |
| 2009/0294056 A1 | 12/2009 | Yoshimura et al. |
| 2009/0302466 A1 | 12/2009 | Shoji et al. |
| 2010/0006987 A1 | 1/2010 | Murugan et al. |
| 2010/0044860 A1 | 2/2010 | Haba et al. |
| 2010/0052189 A1 | 3/2010 | Sakurai et al. |
| 2010/0093131 A1 | 4/2010 | Maeda |
| 2010/0102452 A1 | 4/2010 | Nakao |
| 2010/0164355 A1 | 7/2010 | Son et al. |
| 2010/0255262 A1 | 10/2010 | Chen et al. |
| 2010/0301485 A1 | 12/2010 | Sekine et al. |
| 2010/0327443 A1 | 12/2010 | Kim |
| 2011/0008632 A1 | 1/2011 | Zheng et al. |
| 2011/0012263 A1 | 1/2011 | Hata et al. |
| 2011/0074027 A1 | 3/2011 | Kwon |
| 2011/0074040 A1 | 3/2011 | Frank et al. |
| 2011/0084403 A1* | 4/2011 | Yang .................. H01L 25/50 257/777 |
| 2011/0278063 A1 | 11/2011 | Chen et al. |
| 2012/0025365 A1 | 2/2012 | Haba |
| 2012/0042515 A1 | 2/2012 | Shoji et al. |
| 2012/0211549 A1 | 8/2012 | Yamakami et al. |
| 2012/0211894 A1 | 8/2012 | Aoyagi |
| 2012/0212384 A1 | 8/2012 | Kam et al. |
| 2012/0217165 A1 | 8/2012 | Feng et al. |
| 2012/0248618 A1 | 10/2012 | Akino |
| 2012/0273936 A1 | 11/2012 | Uang et al. |
| 2012/0305298 A1 | 12/2012 | Uang et al. |
| 2013/0020704 A1 | 1/2013 | Sadaka |
| 2013/0040451 A1 | 2/2013 | Dragoi et al. |
| 2013/0099376 A1 | 4/2013 | Haba |
| 2013/0136917 A1 | 5/2013 | Dastoor et al. |
| 2013/0221527 A1 | 8/2013 | Yang et al. |
| 2013/0252399 A1 | 9/2013 | Leduc |
| 2013/0270328 A1* | 10/2013 | Di Cioccio ............ H01L 24/05 228/205 |
| 2013/0320556 A1 | 12/2013 | Liu et al. |
| 2014/0001636 A1 | 1/2014 | Saito et al. |
| 2014/0007351 A1 | 1/2014 | Cohen |
| 2014/0077351 A1 | 3/2014 | Haba |
| 2014/0105674 A1 | 4/2014 | Hayashi et al. |
| 2014/0153210 A1 | 6/2014 | Uzoh |
| 2014/0175655 A1 | 6/2014 | Chen et al. |
| 2014/0191418 A1 | 7/2014 | Cheng et al. |
| 2014/0225795 A1 | 8/2014 | Yu |
| 2014/0231996 A1 | 8/2014 | Fujisawa |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0014399 A1 | 1/2015 | Ogashiwa et al. |
| 2015/0027755 A1 | 1/2015 | Tsujimoto et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0245474 A1 | 8/2015 | Takahashi et al. |
| 2015/0340269 A1 | 11/2015 | Rivoire et al. |
| 2015/0357538 A1 | 12/2015 | Hsing Chen et al. |
| 2015/0380368 A1 | 12/2015 | Momose et al. |
| 2016/0020183 A1 | 1/2016 | Chuang et al. |
| 2016/0049384 A1 | 2/2016 | Lu et al. |
| 2016/0133598 A1 | 5/2016 | Baudin et al. |
| 2016/0168715 A1 | 6/2016 | Ma et al. |
| 2016/0190103 A1 | 6/2016 | Kabe et al. |
| 2016/0192496 A1 | 6/2016 | Wang et al. |
| 2016/0247778 A1 | 8/2016 | Katkar et al. |
| 2016/0276383 A1 | 9/2016 | Chuang et al. |
| 2016/0343682 A1 | 11/2016 | Kawasaki |
| 2017/0069575 A1 | 3/2017 | Haba et al. |
| 2017/0086320 A1 | 3/2017 | Barber |
| 2017/0194271 A1 | 7/2017 | Hsu et al. |
| 2017/0355040 A1 | 12/2017 | Utsumi et al. |
| 2017/0358553 A1* | 12/2017 | Kim .................... H01L 24/92 |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |

(56) References Cited

U.S. PATENT DOCUMENTS

| | | |
|---|---|---|
| 2018/0190580 A1 | 7/2018 | Haba et al. |
| 2018/0190583 A1 | 7/2018 | DeLaCruz et al. |
| 2018/0190876 A1 | 7/2018 | Liu et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0319007 A1 | 10/2019 | Uzoh et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0225801 A1 | 7/2021 | Uzoh |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0165692 A1 | 5/2022 | Uzoh et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132060 A1 | 4/2023 | Uzoh |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |

FOREIGN PATENT DOCUMENTS

| | | |
|---|---|---|
| CN | 203013712 U | 6/2013 |
| DE | 102006006825 A1 | 8/2007 |
| EP | 0615283 A1 | 9/1994 |
| EP | 1091406 A2 | 4/2001 |
| EP | 1255295 A1 | 11/2002 |
| EP | 1387402 A2 | 2/2004 |
| EP | 1471570 A1 | 10/2004 |
| EP | 1602749 | 12/2005 |
| JP | 54148484 | 11/1979 |
| JP | 57107501 | 7/1982 |
| JP | 62117346 A | 5/1987 |
| JP | 63153889 | 6/1988 |
| JP | 64086527 | 3/1989 |
| JP | H04-151843 A | 5/1992 |
| JP | 06268015 A | 9/1994 |
| JP | 7211722 A | 8/1995 |
| JP | 08031835 | 2/1996 |
| JP | 10013003 | 1/1998 |
| JP | H10-125734 A | 5/1998 |
| JP | 11087556 | 3/1999 |
| JP | 11097576 A | 4/1999 |
| JP | 11111886 | 4/1999 |
| JP | 2000-100869 A | 4/2000 |
| JP | 2000-277649 A | 10/2000 |
| JP | 2001-118872 A | 4/2001 |
| JP | 2001-244365 A | 9/2001 |
| JP | 2002-016096 A | 1/2002 |
| JP | 2002-043506 A | 2/2002 |
| JP | 2002-124548 A | 4/2002 |
| JP | 2002-261204 A | 9/2002 |
| JP | 2002-313993 A | 10/2002 |
| JP | 2002-313996 A | 10/2002 |
| JP | 2002-353416 A | 12/2002 |
| JP | 2002-359471 A | 12/2002 |
| JP | 2003-007768 A | 1/2003 |
| JP | 2003-037135 A | 2/2003 |
| JP | 2003-051665 A | 2/2003 |
| JP | 2003-092472 A | 3/2003 |
| JP | 2003-124250 A | 4/2003 |
| JP | 2004-128230 A1 | 4/2004 |

(56) References Cited

FOREIGN PATENT DOCUMENTS

| | | |
|---|---|---|
| JP | 2004-221450 A | 8/2004 |
| JP | 2004-273957 A | 9/2004 |
| JP | 2004-342802 A | 12/2004 |
| JP | 2004-349390 A | 12/2004 |
| JP | 2005-026645 A | 1/2005 |
| JP | 2005-032964 A | 2/2005 |
| JP | 2005-045191 A | 2/2005 |
| JP | 2005-072270 A | 3/2005 |
| JP | 2005-093512 A | 4/2005 |
| JP | 2005-123547 A | 5/2005 |
| JP | 2005-216696 A | 8/2005 |
| JP | 2005-243761 A | 9/2005 |
| JP | 2005-285986 A | 10/2005 |
| JP | 2006-005322 A | 1/2006 |
| JP | 2007-023338 A | 2/2007 |
| JP | 2007-129207 A | 5/2007 |
| JP | 2007-242900 A | 9/2007 |
| JP | 2007-266555 A | 10/2007 |
| JP | 2009-177118 A | 6/2009 |
| JP | 2010-521587 A | 6/2010 |
| JP | 2013-033786 A | 2/2013 |
| JP | 2018-129475 | 8/2018 |
| JP | 2018-160519 | 10/2018 |
| KR | 2010-0092428 | 6/2010 |
| KR | 10-2016-0066272 | 6/2016 |
| WO | WO 01/41207 A1 | 6/2001 |
| WO | WO 2005/043584 A2 | 5/2005 |
| WO | WO 2005/122706 A2 | 12/2005 |
| WO | WO 2006/004672 A1 | 1/2006 |
| WO | WO 2007/069606 A1 | 6/2007 |
| WO | WO 2008/000020 A1 | 1/2008 |
| WO | WO 2008/076428 A1 | 6/2008 |
| WO | WO 2008/112318 A2 | 9/2008 |
| WO | WO 2009/017756 A2 | 2/2009 |
| WO | WO 2009/020572 A2 | 2/2009 |
| WO | WO 2009/023283 A2 | 2/2009 |
| WO | WO 2009/023284 A2 | 2/2009 |
| WO | WO 2009/045371 A2 | 4/2009 |
| WO | WO 2016/136064 A1 | 9/2016 |

OTHER PUBLICATIONS

Che, F.X. et al., "Study on Cu protrusion of through-silicon via," IEEE Transactions on Components, Packaging and Manufacturing Technology, May 2013, vol. 3, No. 5, pp. 732-739.
Chinese Office Action dated Dec. 2, 2022, in Chinese Application No. 201780064766.8, 12 pages.
Choubey, A. et al., "Intermetallics characterization of lead-free solder joints uder isothermal aging," Journal of Electronic Materials, May 28, 2008, vol. 37, No. 8, pp. 1130-1138, XP002555807.
Definition of Pad, printout from Merriam-Webster, printed on Feb. 25, 2013.
Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.
De Messemaeker, Joke et al., "Correlation between Cu microstructure and TSV Cu pumping," 2014 Electronic Components & Technology Conference, pp. 613-619.
Di Cioccio, L. et al., "An overview of patterned metal/dielectric surface bonding: Mechanism, alignment and characterization," Journal of The Electrochemical Society, 2011, vol. 158, No. 6, pp. P81-P86.
Ganesan, Kousik, "Capable copper electrodeposition process for integrated circuit-substrate packaging manufacturing," A dissertation presented in partial fulfillment of the requirements for the degree Doctor of Philosophy, Arizona State University, May 2018, 320 pages.
Gondcharton, P. et al., "Kinetics of low temperature direct copper-copper bonding," Microsyst Technol, 2015, vol. 21, pp. 995-1001.
Heryanto, A. et al., "Effect of copper TSV annealing on via protrustion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.
Huang, Q., "Effects of impurity elements on isothermal grain growth of electroplated copper," Journal of The Electrochemical Society, 2018, vol. 165, No. 7, pp. D251-D257.
Huang, Q., "Impurities in the electroplated sub-50 nm Cu lines: The effects of the plating additives," Journal of The Electrochemical Society, 2014, vol. 161, No. 9, pp. D388-D394.
Jiang, T. et al., "Plasticity mechanism for copper extrusion in through-silicon vias for three-dimensional interconnects," Applied Physics Letters, 2013, vol. 103, pp. 211906-1-211906-5.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.
Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.
Liu, C. et al., "Low-temperature direct copper-to-copper bonding enabled by creep on (111) surfaces of nanotwinned Cu," Scientific Reports, May 12, 2015, 5:09734, pp. 1-11.
Liu, Chien-Min et al., "Effect of grain orientations of Cu seed layers on the growth of <111>-oriented nanotwinned Cu," Scientific Reports, 2014, vol. 4, No. 6123, 4 pages.
Liu, Zi-Yu et al. "Detection and formation mechanism of microdefects in ultrafine pitch Cu-Cu direct bonding," Chin. Phys. B, 2016, vol. 25, No. 1, pp. 018103-1-018103-7.
Lu, L. et al., "Grain growth and strain release in nanocrystalline copper," Journal of Applied Physics, vol. 89, Issue 11, pp. 6408.
Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.
Menk, L.A. et al., "Galvanostatic plating with a single additive electrolyte for bottom-up filling of copperin Mesoscale TSVs," Microsystems and Engineering Sciences Applications (MESA) Complex, Sandia National Laboratories, Albuquerque, New Mexico, 2019 J. Electrochem. Soc. 166, 17 pages.
Milan, Paunovic, Mordechay Schlesinger, Dexler D. Snyder, Modern Electroplating, Fifth Edition, 2010 Wiley & Sons, pp. 1-32.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2-SiO2 bonding with hydrofluoric acid. Room temperature and low stress bonding technique for MEMS," Sensors and Actuators, 2000, vol. 79, pp. 237-244.
Neo-Manhattan Technology, A Novel HDI Manufacturing Process, "High-density interconnects for advanced flex substrates & 3-D package stacking," IPC Flex & Chips Symposium, Tempe, AZ, Feb. 11-12, 2003.
North Corporation, "Processed intra-layer interconnection material for PWBs [Etched Copper Bump with Copper Foil]," NMBITM, Version 2001.6.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Ortleb, Thomas et al., "Controlling macro and micro surface topography for a 45nm copper CMP process using a high resolution profiler," Proc. of SPIE, 2008, vol. 6922, 11 pages.
Parthasaradhy, N.V., "Practical Electroplating Handbook," 1989, Prentice-Hall, Inc., pp. 54-56.

(56) References Cited

OTHER PUBLICATIONS

Plobi, A. et al., "Wafer direct bonding: tailoring adhesion between brittle materials," Materials Science and Engineering Review Journal, 1999, R25, 88 pages.

Saraswat, Stanford Presentation, Cu Interconnect slides, web page web.stanford.edu/class/ee311/NOTES/Cu_Interconnect_Slides.pdf, 19 pages.

Song, Xiaohui, "Atomic study of copper-copper bonding using nanoparticles," Journal of Electronic Packaging, Jun. 2020, vol. 142, 5 pages.

Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

Taiwan Office Action dated Nov. 29, 2022, for Taiwan Application No. 106134536, 3 pages.

Takahashi, K. et al., "Transport phenomena that control electroplated copper filling of submicron vias and trenches," Journal of The Electrochemical Society, 1999, vol. 146, No. 12, pp. 4499-4503.

Yamada, H. et al., "A fine pitch and high aspect ratio bump array for flip-chip interconnection," Proceedings of the International Electronic Manufacturing Technology Symposium, Baltimore, USA, Sep. 28-30, 1992, New York, USA, IEEE, vol. SYMP.13, Sep. 28, 1992, pp. 288-292, XP010259441.

Yamada, H. et al., "A fine pitch and high aspect ratio bump fabrication process for flip-chip interconnection," Proceedings of the Electronic Manufacturing Technology Symposium, Omiya, Japan, Dec. 4-6, 1995, New York, USA, IEEE, Dec. 4, 1995, pp. 121-124, XP010195564.

Zheng, Z. et al., "Study of grain size effect of Cu metallization on interfacial microstructures of solder joints," Microelectronics Reliability, 2019, vol. 99, pp. 44-51.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Lau, John H., "Recent advances and trends in Cu-Cu hybrid bonding," IEEE Transactions on Components, Packaging and Manufacturing Technology, Mar. 2023, vol. 13, No. 3, pp. 399-425.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part No. "ONSEMI AR0820.".

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

\* cited by examiner

FIG. 7
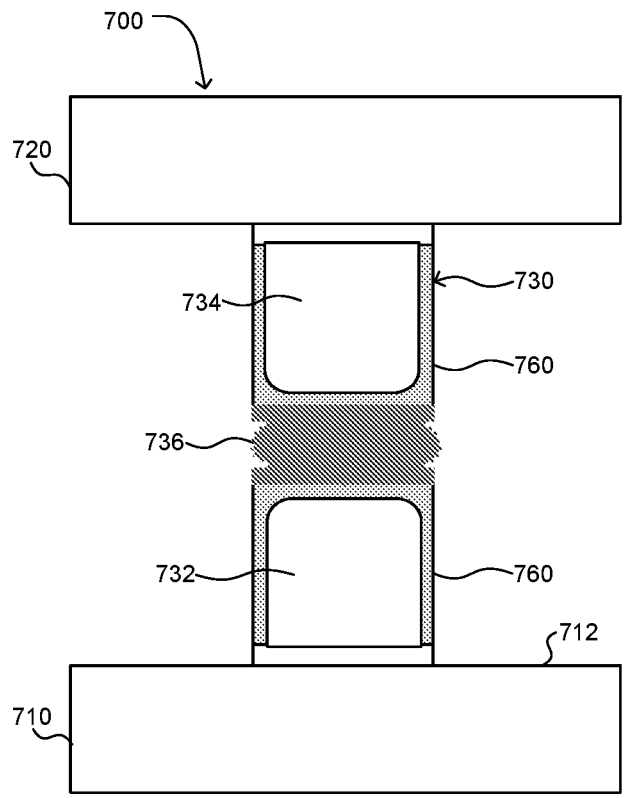
FIG. 8A
FIG. 8B
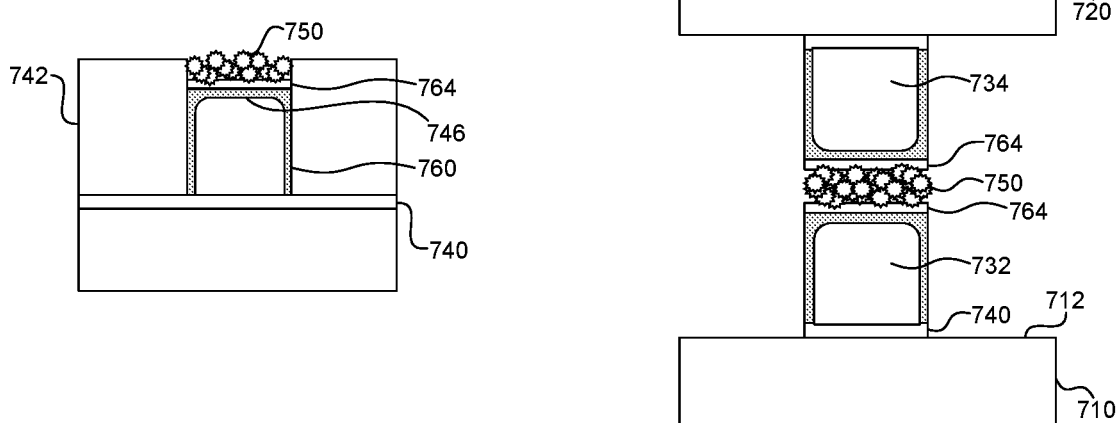

STRUCTURES FOR LOW TEMPERATURE BONDING USING NANOPARTICLES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

CROSS-REFERENCE TO RELATED APPLICATIONS

This application is a continuation of U.S. application Ser. No. 17/140,519, filed on Jan. 4, 2021, which is continuation of U.S. application Ser. No. 16/740,670, filed on Jan. 13, 2020, now U.S. Pat. No. 10,892,246, which is a continuation of U.S. application Ser. No. 15/937,149, filed on Mar. 27, 2018, now U.S. Pat. No. 10,535,626, which is a divisional of U.S. application Ser. No. 15/336,192, filed on Oct. 27, 2016, now U.S. Pat. No. 10,886,250, the disclosures of which are hereby incorporated herein by reference in their entireties for all purposes.

This application is also related to U.S. application Ser. No. 14/796,381, filed on Jul. 10, 2015, now U.S. Pat. No. 9,633,971, the disclosure of which is hereby incorporated herein by reference in its entirety for all purposes.

BACKGROUND OF THE INVENTION

The present invention relates to microelectronic packages, to components for use in fabrication of microelectronic packages, and to methods of making the packages and components.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

In one face of the semiconductor chip is fabricated the active circuitry. To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, gold, or aluminum, around 0.5 μm thick. The size of the bond pads will vary with the device type but will typically measure tens to hundreds of microns on a side.

Flip-chip interconnection is a commonly used scheme for conductively connecting bond pads on the semiconductor chip to contact pads on a substrate, or to one or more other semiconductor chips. In flip-chip interconnection, lumps of metal are typically placed or formed on each bond pad. The die is then inverted so the metal lumps provide both the electrical pathway between the bond pads and the substrate as well as the mechanical attachment of the die to the substrate.

There are many variations of the flip-chip process, but one common configuration is to use solder for the lumps of metal and fusion of the solder as the method of fastening it to the bond pads and the substrate. When it melts, the solder flows to form truncated spheres.

It is becoming more difficult to package semiconductor chips in a flip-chip manner in which the contacts of the chip face toward corresponding contacts of a package substrate. Increased density of the chip contacts is causing the pitch between contacts to be reduced. Consequently, the volume of solder available for joining each chip contact to the corresponding package contact is reduced. A risk with the use of a relatively small volume of solder for contact joining is that the entire volume of solder may be converted into a brittle inter-metallic compound with the metal of the contacts, which may jeopardize the reliability of the solder joints.

Moreover, smaller solder joints cause the stand-off height between the contact-bearing chip surface and the adjacent face of the package substrate to be reduced. However, when the contact density is very high, the stand-off height may need to be greater than the height of a simple solder joint in order to form a proper underfill between the adjacent surfaces of the chip and package substrate. In addition, it may be necessary to require a minimum stand-off height in order to allow the contacts of the package substrate to move somewhat relative to the contacts of the chip in order to compensate for differential thermal expansion between the chip and the substrate.

One approach that has been proposed to address these concerns involves forming metal columns by electroplating a metal such as copper directly on the chip contacts, using a photoresist mask overlying the chip front surface to define the locations and height of the columns. The chip with the columns extending from the bond pads thereon can then be joined to corresponding contacts of the package substrate. Alternatively, a similar approach can be taken to form metal columns on exposed pads of the substrate. The substrate with the columns extending from the contacts thereon can then be joined to corresponding contacts of the chip.

However, the process of forming the columns by electroplating can be problematic when performed simultaneously over a large area, such as, for example, the entire area of a wafer (having a diameter from about 200 millimeters to about 300 millimeters) or over the entire area of a substrate panel (typically having dimensions of about 500 millimeters square). It is difficult to achieve metal columns with uniform height, size and shape across the substrate. All of these are very difficult to achieve when the size and height of the columns is very small, e.g., at column diameters of about 75 microns or less and column heights of about 50 microns or less. Variations in the thickness of the photoresist mask, uniformity of the pattern layout, local variation in pad density, local variation in mass transport of the electrolyte, local variations in the plating current distribution, or variations in the size of shape of patterns over a large area such as a wafer or substrate panel can interfere with obtaining columns of uniform height, size and shape.

In another method, bumps of solder paste or other metal-filled paste can be stenciled onto conductive pads on an exposed surface of a substrate panel. The bumps can then be flattened by subsequent coining to improve planarity. However, tight process control can be required to form bumps having uniform solder volume, especially when the pitch is very small, e.g., about 50 microns or less. It can also be very difficult to eliminate the possibility of solder-bridging between bumps when the pitch is very small, e.g., about 50 microns or less.

Despite the advances that have been made in flip chip interconnections, there is still a need for further improvements.

BRIEF SUMMARY OF THE INVENTION

A method of making an assembly can include forming a first conductive element at a first surface of a substrate of a first component, the first conductive element extending in a direction away from the first surface, and forming conductive nanoparticles at a surface of the conductive element by exposure to an electroless plating bath, the conductive nanoparticles having long dimensions smaller than 100 nanometers. The method can also include juxtaposing the surface of the first conductive element with a corresponding surface of a second conductive element at a major surface of a substrate of a second component, with the conductive nanoparticles disposed between the surfaces of the first and second conductive elements. The method can further include elevating a temperature at least at interfaces of the juxtaposed first and second conductive elements to a joining temperature at which the conductive nanoparticles cause metallurgical joints to form between the juxtaposed first and second conductive elements.

In one example, the first conductive element can be one of a plurality of first conductive elements at the first surface, and the second conductive element can be one of a plurality of second conductive elements at the major surface, corresponding surfaces of the first and second conductive elements being juxtaposed with one another. The method can also include, during the juxtaposing step, compressing the thickness of the bond region by different distances among different ones of the juxtaposed first and second conductive elements, the thickness of the bond region varying among the different ones of the juxtaposed first and second conductive elements by up to 3 microns so as to accommodate non-coplanarity of the top surfaces of the at least some of the first conductive elements.

In a particular embodiment, the first conductive element can be a substantially rigid post, and the surface of the substantially rigid post can be a top surface that projects a height above the first surface of the first component such that the top surface is remote from the first surface, the post having edge surfaces extending at substantial angles away from the top surface. The forming of the conductive nanoparticles can deposit the conductive nanoparticles onto the edge surfaces of the post, the nanoparticles substantially completely covering the top surface and the edge surfaces of the post.

In one embodiment, after the elevating temperature step, the interface of the juxtaposed first and second conductive elements can contain microvoids, each microvoid having a maximum width below 0.5 microns. In a particular example, at least one of the first or second components can be a microelectronic element including active semiconductor devices, and the joining temperature can be not more than 150° C. In an exemplary embodiment, at least one of the first and second conductive elements can comprise an electrically conductive pad, an electrically conductive trace, or an electrically conductive substantially rigid post.

Another method of making an assembly can include forming conductive nanoparticles at a surface of a first conductive element at a first surface of a substrate of a first component by exposing the first conductive element to an electrolytic bath at a current density greater than the mass transport limiting current density of the plating bath, the conductive nanoparticles having long dimensions smaller than 100 nanometers. The method can also include juxtaposing the surface of the first conductive element with a corresponding surface of a second conductive element at a major surface of a substrate of a second component, with the conductive nanoparticles disposed between the surfaces of the first and second conductive elements. The method can further include elevating a temperature at least at interfaces of the juxtaposed first and second conductive elements to a joining temperature at which the conductive nanoparticles cause metallurgical joints to form between the juxtaposed first and second conductive elements.

In one example, the method can also include, before forming the conductive nanoparticles, forming the plurality of first conductive elements by depositing a seed layer onto the first surface of the substrate of the first component and forming the first conductive elements extending from the seed layer. In a particular embodiment, the method can also include, after forming the conductive nanoparticles, forming a dielectric mask covering the conductive nanoparticles and removing a portion of the seed layer from the first surface adjacent the first conductive element. In one embodiment, the method can also include, before forming the conductive nanoparticles, forming the first conductive element on the first surface of a substrate of the first component, the first conductive element extending in a direction away from the first surface.

In a particular example, the first conductive element can be a substantially rigid post, and the surface of the first conductive element can be a top surface that projects a height above the first surface of the first component such that the top surface is remote from the first surface, the post having edge surfaces extending at substantial angles away from the top surface thereof. In an exemplary embodiment, the second conductive element can be a substantially rigid post, and the surface of the second conductive element can be a top surface that projects a height above the major surface of the second component such that the top surface is remote from the major surface, the post of the second component having edge surfaces extending at substantial angles away from the top surface thereof. In one example, at least one of the first and second conductive elements can comprise an electrically conductive pad, an electrically conductive trace, or an electrically conductive substantially rigid post.

An assembly can include a first component including a substrate having a first surface and a plurality of substantially rigid first posts at the first surface, the first posts extending away from the first surface in a first direction, each first post having a top surface generally facing in the first direction, the top surface of each of the first posts projecting a height above the first surface such that the top surface is remote from the first surface, each first post having edge surfaces extending at substantial angles away from the top surface thereof. The assembly can also include a second component including a substrate having a major surface and a plurality of second conductive elements at the major surface, each second conductive element having a top surface generally facing in a second direction.

The first posts can be joined with the second conductive elements, such that the top surfaces of the first posts at least partially confront the top surfaces of the second conductive elements. The top surfaces of at least some of the first posts can be non-coplanar with respect to one another. Each first post can be electrically interconnected to a corresponding one of the second conductive elements by a bond region including impurities that show structural evidence of the use of metal nanoparticles having long dimensions smaller than 100 nanometers in the joining process. Each bond region can penetrate at least partially into the first post and the second conductive element. Each bond region can contain a plurality of microvoids. Each microvoid can have a maximum width below 0.5 microns. The thickness of different ones of the bond regions can vary by up to 3 microns so as to accommodate the non-coplanarity of the top surfaces of the at least some of the first posts.

In one example, the assembly can also include a barrier layer substantially completely covering the top surface and the edge surfaces of each first post, each bond region being located between the barrier layer of a respective one of the first posts and the top surface of a corresponding one of the second conductive elements. In a particular embodiment, the plurality of second conductive elements can be substantially rigid second posts extending away from the major surface in the second direction, and the top surface of each of the second posts can project a height above the major surface of the second component such that the top surface is remote from the major surface, each second post having edge surfaces extending at substantial angles away from the top surface thereof. In one embodiment, the edge surfaces of each of the first posts and second posts can have a surface roughness of at least 3.0 nanometers. In a particular example, at least one of the first or second components can be a microelectronic element including active semiconductor devices.

In an exemplary embodiment, the first posts and the second conductive elements can each consist essentially of the same material, and the bond region can include at least one metal selected from a group consisting of copper, gold, silver, nickel, tin, aluminum, an alloy including silver, an alloy including indium, and an alloy including tin. In one example, at least one of the first posts and second conductive elements can comprise an electrically conductive pad, an electrically conductive trace, or an electrically conductive substantially rigid post. In a particular embodiment, the first component can be a microelectronic element wafer including a plurality of microelectronic element portions, each microelectronic element portion including a respective subset of the first posts at the first surface, and the second component can be at least a portion of a substrate panel including a plurality of substrate portions, each substrate portion including a respective subset of the second conductive elements at the major surface.

Another method of making an assembly can include juxtaposing a top surface of a first electrically conductive element at a first surface of a first substrate with a top surface of a second electrically conductive element at a major surface of a second substrate. One of: the top surface of the first conductive element can be recessed below the first surface of the first substrate, or the top surface of the second conductive element can be recessed below the major surface of the second substrate. Electrically conductive nanoparticles can be disposed between the top surfaces of the first and second conductive elements. The conductive nanoparticles can have long dimensions smaller than 100 nanometers. The method can also include elevating a temperature at least at interfaces of the juxtaposed first and second conductive elements to a joining temperature at which the conductive nanoparticles can cause metallurgical joints to form between the juxtaposed first and second conductive elements.

In a particular embodiment, the method can also include forming the electrically conductive nanoparticles including exposing at least one receiving surface being at least one of the top surfaces of the first and second conductive elements to an electroless plating bath or an electrolytic bath at a current density greater than the mass transport limiting current density of the electrolytic bath. In one example, at least one of the first and second conductive elements can include an electrically conductive pad, an electrically conductive trace, or an electrically conductive substantially rigid post. In an exemplary embodiment, the first conductive element can be a substantially rigid post. The top surface of the substantially rigid post can be remote from the first surface of the first component and can project a height above the first surface. The substantially rigid post can have edge surfaces extending at substantial angles away from the top surface thereof. The top surface of the second conductive element can be disposed in a recess extending below the major surface.

In one example, the first conductive element can be a substantially rigid post. The top surface of the substantially rigid post can be remote from the first surface of the first component and can project a height above the first surface. The substantially rigid post can have edge surfaces extending at substantial angles away from the top surface thereof. After the juxtaposing, the top surface of the substantially rigid post can be disposed in a recess extending below the major surface of the second substrate.

In a particular example, the method can also include etching the major surface of the substrate of the second component to form the recess and to expose the top surface of the second conductive element within the recess. In one embodiment, before the juxtaposing of the top surfaces of the first and second electrically conductive elements, the electrically conductive nanoparticles can be disposed on the top surface of both of the first and second electrically conductive elements. In one example, before the juxtaposing of the top surfaces of the first and second electrically conductive elements, the electrically conductive nanoparticles can be disposed on the top surface of one of the first or second electrically conductive elements. In a particular embodiment, before the juxtaposing of the top surfaces of the first and second electrically conductive elements, the conductive nanoparticles can include first and second layers of conductive nanoparticles overlying each top surface.

The first layer of conductive nanoparticles can be disposed on the respective top surface and the second layer of conductive nanoparticles can be disposed on the first layer of conductive nanoparticles. The second layer of conductive nanoparticles can include at least one material different than at least one material comprising the first layer of conductive nanoparticles. In one example, before the juxtaposing of the top surfaces of the first and second electrically conductive elements, the conductive nanoparticles on each top surface can include a third layer of conductive nanoparticles formed on the respective second layer of conductive nanoparticles. The third layer of conductive nanoparticles can include at least one material different than the at least one material comprising the second layer of conductive nanoparticles. The second layer of conductive nanoparticles can include a barrier metal configured to prevent metal of the third layer of conductive nanoparticles from penetrating into the first layer of conductive nanoparticles.

In an exemplary embodiment, the method can also include, before the temperature is elevated, depositing solder onto the conductive nanoparticles on at least one of the top surfaces of the first and second electrically conductive elements. During the elevating of the temperature, the solder can fill gaps between at least some of the conductive nanoparticles via capillary action. In a particular example, the first surface of the substrate of the first component and the major surface of the substrate of the second component can each comprise a dielectric material. During the elevating of the temperature, the dielectric material of the first surface can directly bond with the dielectric material of the major surface. In one embodiment, the dielectric material at the first surface and the major surface can each include a B-stage material layer that is not fully cured. During the elevating of the temperature, the B-stage material layers can be fully cured.

Another assembly can include a first component including a substrate having a first surface and a plurality of substantially rigid first posts of metal at the first surface. The first posts can extend away from the first surface in a first direction. Each first post can have a top surface generally facing in the first direction. The top surface of each of the first posts can project a height above the first surface such that the top surface is remote from the first surface. Each first post can have edge surfaces extending at substantial angles away from the top surface thereof. The assembly can also include a second component including a substrate having a major surface and a plurality of second conductive elements exposed at the major surface. Each second conductive element can have a top surface generally facing in a second direction.

The top surface of each second conductive element can be exposed in a recess extending below the major surface. The first posts can be joined with the second conductive elements, such that the top surfaces of the first posts at least partially confront the top surfaces of the second conductive elements, and such that at least some of the first posts at least partially extend into corresponding ones of the recesses of the second component. Each first post can be electrically interconnected to a corresponding one of the second conductive elements by a bond region including impurities that show structural evidence of the use of conductive nanoparticles having long dimensions smaller than 100 nanometers in the joining process. Each bond region can penetrate at least partially into the first post and the second conductive element.

In a particular embodiment, each bond region can include impurities that show structural evidence of first, second, and third layers of electrically conductive nanoparticles. The second layer of conductive nanoparticles can be disposed between the first and third layers of conductive nanoparticles and can include at least one material different than at least one material comprising the first layer of conductive nanoparticles and different than at least one material comprising the third layer of conductive nanoparticles. In one example, each bond region can includes impurities that show structural evidence of first, second, third, fourth, and fifth layers of electrically conductive nanoparticles. The first and fifth layers of conductive nanoparticles can penetrate at least partially into the first post and the second conductive element, respectively.

The second and fourth layers of conductive nanoparticles can each include at least one material different than at least one material comprising the first and fifth layers of conductive nanoparticles, respectively. Each of the second and fourth layers of conductive nanoparticles can include a barrier metal configured to prevent metal of the third layer of conductive nanoparticles from penetrating into the first and fifth layers of conductive nanoparticles. In an exemplary embodiment, each bond region can include solder extending into microvoids located between at least some of the conductive nanoparticles, each microvoid having a maximum width below 0.5 microns.

In a particular example, the first surface of the substrate of the first component and the major surface of the substrate of the second component can each comprise a dielectric material, and the dielectric material of the first surface can be directly bonded with the dielectric material of the major surface. In one embodiment, at least one of the substrates of the first component and the second component can have a metal element extending in a respective plane in first and second transverse directions within the respective substrate. The metal element can be configured to provide electromagnetic shielding to reduce signal noise of signals traveling between the first and second conductive elements.

In a particular embodiment, both of the substrates of the first component and the second component can have the metal element extending in the respective plane in the first and second transverse directions within the respective substrate. The metal element of the first component can include traces extending in the first direction, and the metal element of the second component can include traces extending in the second direction. In one example, the metal element can be a continuous metal sheet having an opening extending therethrough aligned in the first and second directions with the first and second conductive elements. In an exemplary embodiment, at least one of the first or second components can be a microelectronic element including active semiconductor devices.

In one embodiment, a system can include an assembly as described above and one or more other electronic components electrically connected to the assembly. In a particular example, the system can also include a housing, the assembly and the other electronic components being mounted to the housing. Further aspects of the invention can provide systems that incorporate assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

BRIEF DESCRIPTION OF THE DRAWINGS

FIG. 7 is a diagrammatic side sectional view of an assembly according to an alternative embodiment of the assembly shown in FIG. 5.

FIGS. 8A and 8B are side sectional views illustrating stages of fabrication in accordance with the embodiment depicted in FIG. 7.

DETAILED DESCRIPTION OF THE PREFERRED EMBODIMENT

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In some embodiments, the conductive element may be attached to the surface or may be disposed in one or more layers of dielectric coating on the said surface.

Figure 1:
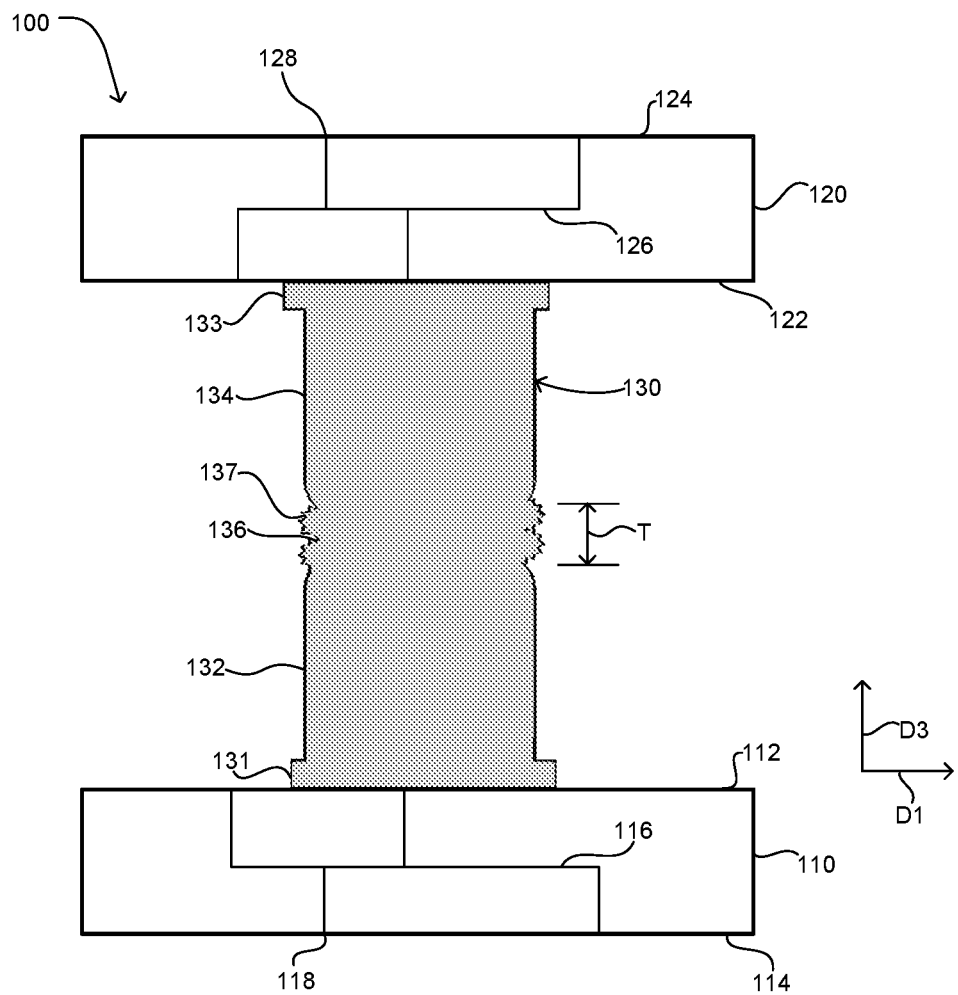
FIG. 1 is a diagrammatic side sectional view of an assembly according to an embodiment of the present invention.

As illustrated in FIG. 1, an assembly 100 can include a first substrate 110 having a major surface 112 extending in a first direction D1 and in a second direction transverse to the first direction, a second substrate 120 having a major surface 122 extending in the first and second directions, and a conductive column 130 extending in a third direction D3 transverse to the first and second directions, the column providing an electrical connection between conductive elements 131 and 133 at the major surface 112 and the major surface 122, respectively. Although only a single column 130 is shown and described with reference to FIG. 1, it is to be understood that the first and second substrates 110, 120 may be joined by an m×n array of conductive columns, one or both of m and n being greater than one. The column 130 (and the other conductive columns described herein) may be used, for example, to carry signals or information, power, heat, or a reference potential, between the first substrate 110 and the second substrate 120.

In FIG. 1, the first and second directions parallel to the major surface 112 and the major surface 122 are referred to herein as "horizontal" or "lateral" directions, whereas the directions perpendicular to the major surfaces, such as the third direction D3, are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

In some embodiments, one or both of the substrates 110 and 120 (or any of the substrates disclosed herein with respect to any of the embodiments) can be a semiconductor chip, a wafer, glass, ceramic, glass-ceramic, a polymer, composite material, a substrate, a microelectronic package, a flat panel, or the like, and combinations thereof. One or both of the substrates 110 and 120 may consist essentially of an inorganic material such as silicon, or a substrate, or an in-process microelectronic package. The thickness of one or both of the substrates 110 and 120 between its major surface and a respective second surface 114 or 124 opposite to the major surface can be less than 500 μm, and can be significantly smaller, for example, 130 μm, 70 μm or even smaller. One or both of the substrates 110 and 120 can be an interposer providing electrical interconnection between the major and second surfaces thereof, and/or one or both of the substrates 110 and 120 can be a microelectronic package having active semiconductor devices therein and terminals at the second surface thereof configured for joining to a component external to the microelectronic package.

One or both of the substrates 110 and 120 (or any of the substrates disclosed herein with respect to any of the embodiments) can have a coefficient of thermal expansion ("CTE") less than 10 parts per million per degree Centigrade in a plane of the substrate ("ppm/° C."). In a particular embodiment, one or both of the substrates 110 and 120 can have a CTE less than 7 ppm/° C. In other embodiments, the CTE of one or both of the substrates 110 and 120 can be less than 20 ppm/° C. In one example, the CTE of one or both of the substrates 110 and 120 can be greater than 22 ppm/° C.

In some embodiments, one or both of the substrates 110 and 120 (or any of the substrates disclosed herein with respect to any of the embodiments) can be made from a material such as semiconductor material, ceramic, glass, liquid crystal material, a composite material such as glass-epoxy or a fiber-reinforced composite, a laminate structure, or a combination thereof. In some embodiments, one or both of the substrates 110 and 120 can be a supporting dielectric element, e.g., a tape used in tape automated bonding ("TAB"). In one example, one or both of the substrates 110 and 120 can consist essentially of a dielectric element having a coefficient of thermal expansion in a plane of the substrate of less than 10 ppm/° C. In a particular embodiment, the substrate 102 can consist essentially of a dielectric element having a coefficient of thermal expansion in a plane of the substrate of between about 10 and about 20 ppm/° C. In one particular embodiment, one or both of the substrates 110 and 120 can consist essentially of a dielectric element having a coefficient of thermal expansion in a plane of the substrate of between about 10 and about 20 ppm/° C. and an out-of-plane coefficient of thermal expansion between about 15 and about 60 ppm/° C. In one example, one or both of the substrates 110 and 120 can have a Young's modulus of less than 4 GPa. In an exemplary embodiment, one or both of the substrates 110 and 120 can have a Young's modulus of less than 100 GPa.

One or both of the substrates 110 and 120 (or any of the substrates disclosed herein with respect to any of the embodiments) can further include an insulating dielectric layer (not shown) overlying the respective major surface 112 or 122 and/or the respective second surface 114 or 124. Such dielectric layers can electrically insulate conductive elements such as the column 130 from the substrate, when the substrate comprises an electrically conductive material or a semiconductor material. These dielectric layers can be referred to as "passivation layers" of the substrate. Such dielectric layers can include an inorganic or organic dielectric material or both. Such dielectric layers can include an electrodeposited conformal coating or other dielectric material, for example, a photoimageable polymeric material, for example, a solder mask material.

One or both of the substrates 110 and 120 (or any of the substrates disclosed herein with respect to any of the embodiments) can further include conductive structure 116 or 126 therein. Such conductive structure can include traces extending along one or both of the major and second surfaces, conductive interconnects or conductive vias extending between or in a direction between the respective major surface 112 or 122 and/or the respective second surface 114 or 124, and terminals 118 or 128 at the respective second surface for electrical connection with a component external to the assembly 100.

In embodiments where one or both of the substrates 110 and 120 include a semiconductor substrate, made for example from silicon, one or a plurality of semiconductor devices (e.g., transistors, diodes, etc.) can be disposed in an active device region thereof located at and/or below the respective major surface 112 or 122.

The conductive column 130 can include a first electrically conductive element or portion 132 and a second electrically conductive element or portion 134. The first portion 132 can be electrically connected to and joined with one or more conductive elements 131 at the major surface 112 of the first substrate 110, and the second portion 134 can be electrically connected to and joined with one or more conductive elements 133 at the major surface 122 of the second substrate 120. Each of the first and second portions 132, 134 can be a metal post extending from the respective major surface 112, 122 in the third direction D3 or in a direction opposite the third direction, such metal posts including substantially rigid elements such as vertically-extending portions of metal. In one embodiment, the width of the first portion 132 in horizontal directions parallel to the major surface 112 (e.g., the direction D1) can be less than the width of the corresponding conductive element 131. Likewise, in a particular example, the width of the second portion 134 in horizontal directions parallel to the major surface 122 (e.g., the direction D1) can be less than the width of the corresponding conductive element 133.

The first and second portions 132, 134 can each include a conductive material such as copper, aluminum, tungsten, solder, gold, nickel, tin, lead, gallium, indium, silver, an alloy including copper, an alloy including nickel, an alloy including tungsten, or a combination of one or more of the aforementioned materials, among others. In one example, each of the first and second portions 132, 134 can consist essentially of copper. The first and second portions 132, 134 can each comprise the same metal, or the first portion may comprise a different metal than the second portion.

The conductive column 130 can also include a first conductive element 131 at the major surface 112 of the first substrate 110 and/or a second conductive element 133 at the major surface 122 of the second substrate 112. Such a conductive element 131 and/or 133 can be a thin, flat pad of metal, such as copper, aluminum, nickel, or another suitable material. In some embodiments, such a conductive element 131 and/or 133 can be substantially thick, and the combined heights of the conductive elements in the vertical direction D3 perpendicular to the major surfaces 112, 122 can be up to 30% of the height of the conductive column 130. In a particular example, the combined heights of the conductive elements in the vertical direction D3 can be up to 70% of the height of the conductive column 130. Such a conductive element 131 or 133 can comprise the same metal as one or both of the first and second portions 132, 134, or it may comprise a metal that is different from that of one or both of the first and second portions. In some embodiments, one or both of the first and second conductive elements 131, 133 can comprise a barrier layer or barrier material. In one example, one or both of the first and second conductive elements 131, 133 can be integrally formed with one or both of the first and second portions 132, 134.

The conductive column 130 can include a bond region 136 that can include structural evidence of nanoparticles having been joined together in a prior bonding operation. As used herein, the term "nanoparticles" includes nanomaterials in any form, including, for example, clusters of nanoparticles having long dimensions typically smaller than about 100 nanometers, nanoparticles suspended in a liquid, or nanoparticles suspended in a paste containing a surfactant. The bonding region may or may not comprise any remaining liquid, e.g., surfactant or solvent. The actual dimensions of the nanoparticles can be significantly smaller, e.g., having dimensions from about one nanometer and larger. In one example, the bond region 136 can penetrate at least partially into each of the first and second portions 132, 134. Such nanoparticles can also be arranged as dendritic deposits at one or more surfaces of metal posts that can comprise the first and second portions 132, 134 of the conductive column 130.

In one example, the bond region 136 can include a layer of nanoparticles consisting essentially of at least one of copper, gold, nickel, silver, alloys including silver, gallium, indium, alloys of gallium or indium, tin, bismuth, eutectic metal alloys, another metal, or a combination of metals. The nanoparticles can be coated with a very thin protective or non-protective layer of material (e.g., gallium, indium, tin, nickel, copper, gold), and the protective layer can be continuous or discontinuous. Such a protective or non-protective layer of material can lower the melting point of the nanoparticles. In one example, nanoparticles deposited onto the first potion 132 can be coated with gallium, and nanoparticles deposited onto the second portion 134 can be coated with indium, which can lower the melting point of the nanoparticles. Such a protective or non-protective layer of material can have a thickness of 5-10 nanometers, for example. Further details about such a protective or non-protective layer of material on nanoparticles can be found in U.S. Pat. No. 9,024,205, which is hereby incorporated herein by reference.

Nanoparticles can experience melting point depression, in which nanoscale materials can melt at temperatures substantially lower than bulk materials. In one example, the melting point of nanoparticles can be hundreds of degrees ° C. lower than that of a bulk region of the same material of which the nanoparticles consist. The melting point depression of metal nanoparticles is most pronounced when the metal has a particle diameter below about 50 nm. Having a bond region 136 that consists essentially of nanoparticles can allow the bond region to have a melting point at room temperature or within a few hundred ° C. above room temperature.

Joining the first and second substrates 110, 120 (and the other first and second substrates 310/510/710 and 320/520/720 described herein) together at a lower temperature (e.g., less than 200° C.) compared to that of conventional joining techniques can improve the structure of the final assembly 100, and can also benefit the process of making the assembly, which can improve yield and efficiency, thereby reducing fabrication cost. Typically, first and second portions 132, 134 (e.g., in the form of electrically conductive posts) of each substrate 110, 120 are juxtaposed in alignment with one another at a temperature just below the joining temperature. Then, the aligned posts are moved into contact with one another, and the assembly is heated to the joining temperature, at which time the nanoparticles on the respective first and second portions 132, 134 bond, such that the columns 130 form. In some embodiments, the nanoparticle regions between the substrates can fuse at room temperature when the mating regions touch. Subsequent higher-temperature processing can serve to improve both the mechanical and electrical integrity of the room-temperature joint. The substrate joining ambient environment can be inert, reducing, or a vacuum. In some applications, metallic oxide reducing fluids can be flowed around the substrates during the joining operation. In one embodiment, the fluid in the joining chamber can comprise a compound that enhances grain growth or grain growth rate in metals, for example, alcohol dispersed in an inert gas such as nitrogen.

In contrast to conventional solder joining processes at temperatures of approximately 250° C., reduced-temperature nanoparticle joining of substrates 110 and 120, which can have substantially different coefficients of thermal expansion, can result in significantly less strain and warpage in the final assembled product (e.g., the assembly 100). The reduced substrate warpage can be beneficial in subsequent assembly processes. This is because the difference between the temperature at which the structure is joined and the temperature at which the assembly is stored or operated is much smaller than with conventional processes. In such way, the assembled structure (e.g., the assembly 100) has less of a tendency to become warped as a result of the assembly process.

Moreover, the connections between individual portions 132, 134 of each column 130 formed at a lower joining temperature need not be quite as strong as in conventional structures, because conducting the assembly process at lower temperatures can apply less stress to each connection due to the smaller temperature differential between the joining temperature and temperatures at which the product is used or stored. The assembled package using the lower thermal budget processes for assembly can stiffen the package at lower temperatures. The stiffer package can have reduced warpage. Moreover, reducing the joining temperature can make it easier to align and join larger substrates together, thereby improving efficiency. These benefits described above can apply to all of the embodiments of the assemblies 100/300/500/700/900/1100/1300/1500/1600 described herein.

After the first and second portions 132, 134 are joined together by nanoparticles or nanomaterials in any form, the bond region 136 that joins the first and second portions together can show structural evidence that nanoparticles were used to join the first and second portions. For example, during joining of the first and second portions 132, 134, nanoparticles can diffuse into the first and second portions. After joining, the metal formerly comprising the nanoparticles are no longer in the form of clusters of nanoparticles having long dimensions typically smaller than about 100 nanometers.

The bond region 136 that joins the first and second portions 132, 134 together can show other structural evidence that nanoparticles were used to join the first and second portions, including the contour of the surface of the bond region. As shown in FIG. 1, the bond region 136 may have a scalloped or jagged surface 137 that generally extends in a circumferential direction about the column 130. The surface 137 of the bond region 136 may have a higher degree of surface roughness than the surface roughness of the first and second portions 132, 134. For example, the surface 137 may have a surface roughness that is greater than 30 nanometers. In one example, the surface 137 may have a surface roughness that is greater than 3.0 nanometers.

Another example of structural evidence that nanoparticles were used to join the first and second portions 132, 134 can be the presence of microvoids within the bond region 136. For example, the bond region 136 may include a plurality of microvoids that are each smaller than 0.5 microns, or the bond region may include microvoids that are each smaller than 0.2 microns. Such microvoids may be filled with air or dielectric material, for example. In one embodiment, the cross section of each void within the bond region can be less than 10% of the cross section of the bonded region. In particular examples, the cross section of each void within the bond region can be less than 5%, or less than 1% of the cross section of the bonded region. In one embodiment, the total area of the cross sections of the voids within a given cross section of the bond region can be less than 10% of the cross section of the bonded region. In particular examples, the total area of the cross sections of the voids within a given cross section of the bond region can be less than 5%, or less than 1% of the cross section of the bonded region.

In embodiments in which the first and second substrates 110, 120 are joined by an array of conductive columns 130, the thickness T of the bond region 136 in the third direction D3 may vary among the array of conductive columns by up to 3 microns, or between 0.5 microns and 3 microns, for example. The variation in the thickness of the bond regions 136 among the conductive columns 130 may be due to non-planarity among the top surfaces of an array of first portions 132 and/or non-planarity among the top surfaces of a corresponding array of second portions 134 before the corresponding first and second portions are joined to one another, as will be described below. In one embodiment, one of the first and second portions 132, 134 can be an electrically conductive trace or an electrically conductive pad (e.g., a flat piece of metal in the shape of a circle, oval, square, or rectangle). Thus, nanomaterials can be used to attach a conductive post to a conductive trace or a conductive pad at the major surface 112 or 122.

Figure 2A:
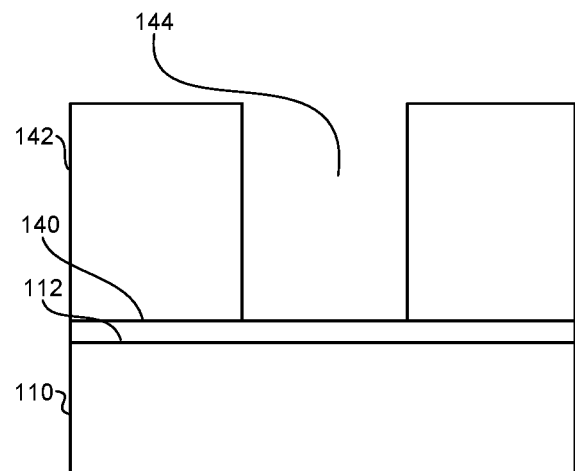
FIGS. 2A-2F are side sectional views illustrating stages of fabrication in accordance with the embodiment depicted in FIG. 1.

A method of fabricating the assembly 100 (FIG. 1) will now be described, with reference to FIGS. 2A-2F. Referring to FIG. 2A, a continuous metal seed layer 140 (e.g., copper) may be deposited onto the major surface 112 of the first substrate 110, or onto a dielectric layer overlying the major surface if the substrate comprises an electrically conductive material or a semiconductor material. The seed layer 140 can be deposited by various methods, including atomic layer deposition (ALD), physical vapor deposition (PVD), or electroless or electrolytic deposition methods, or combinations thereof. The seed layer can comprise copper, for example. The seed layer can also include an adhesion layer, a barrier layer, or both.

After the seed layer 140 is deposited onto the major surface 112, photoimageable layer such as a photoresist layer 142, can be deposited and patterned to cover only portions of the major surface 112. The photoresist layer 142 may have openings 144 at locations along the major surface 112 where it is desired to form columns 130.

Figure 2B:
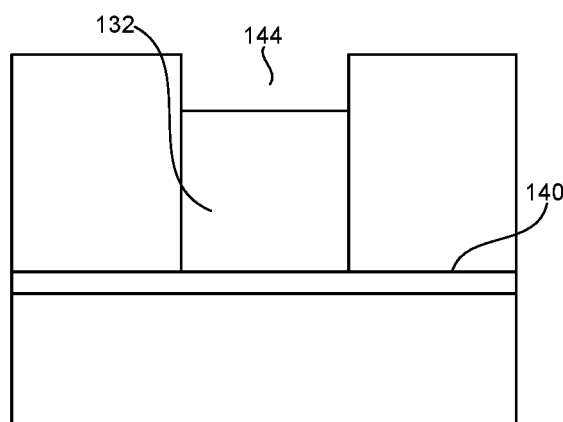

Then, as shown in FIG. 2B, the first portion 132 of the column 130 can be formed by depositing one or more conductive materials (e.g., copper) into the openings 144 in contact with the seed layer 140. In this example, the first portion 132 is deposited by electrolytic deposition. The first portion 132 can extend from the seed layer 140 in the third direction D3.

Figure 2C:
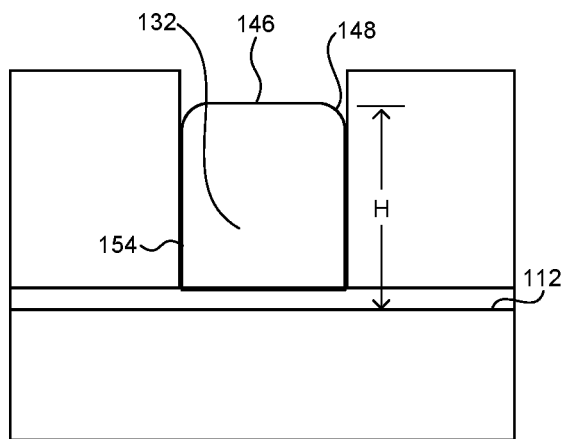

Next, as shown in FIG. 2C, the first portion 132 can be partially etched, defining a top surface 146 of the first portion generally facing in the third direction D3 that may have a rounded peripheral edge 148. This partial or mild etching step can expose high-index metal planes to permit the nanoparticles to nucleate. The first portion 132 can be a unitary substantially rigid metal post, and the top surface 146 can project a height H above the major surface 112 such that the top surface is remote from the major surface. The first portion 132 can define edge surfaces or sidewalls 154 extending at substantial angles away from the top surface 146.

Figure 2D:
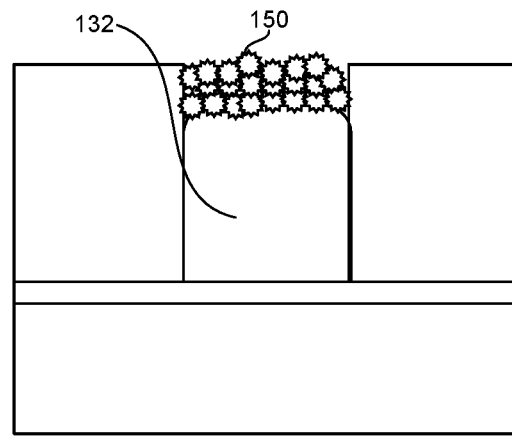

Then, as shown in FIG. 2D, nanoparticles 150 are deposited onto the top surface 146 of the first portion 132. In this example, the nanoparticles 150 are deposited by electrolytic deposition, in which the first portion 132 is exposed to an electrolytic bath at a current density greater than 50 mA/cm$^2$, so as to cause local depletion of metal ions at the top surface 146 during the plating step.

In one embodiment, after plating the first portion 132 onto the seed layer 140, the plating current density or voltage can be increased momentarily beyond the mass transport limit of the plating bath formulation. High current pulse plating can be employed to form the nanoparticles 150. The plating condition can be chosen to generate a layer or region of nanoparticles 150 without incorporating undesirable impurities within the layer or region.

For example, to plate the first portion 132 onto the seed layer 140, a copper plating bath containing organic additives, suppressors, brighteners, levelers, or various combinations thereof, can be used, with current densities between 10 and 40 mA/cm$^2$. Preferably, plating can be performed at current densities below the mass transport limit of the bath formulation, for a sufficient time to permit the first portion to be plated up to the height H shown in FIG. 2C.

To initiate depositing of the nanoparticles 150 onto the top surface 146, the plating current density can then be momentarily increased beyond the mass transport limit of the bath. The nanoparticles 150 can be deposited onto the top surface 146 by cycling the plating current density above and below the mass transport limit of the plating bath chemistry. In one example, the process of depositing the nanoparticles 150 onto the top surface 146 can comprise plating for 3 to 15 milliseconds above the mass transport limit and plating for 20 to 50 milliseconds below the mass transport limit of the plating bath.

The electrolytic deposition bath used to deposit the nanoparticles 150 onto the top surface 146 of the first portion 132 may be the same bath or a different bath than the one that is used to deposit the metal of the first portion 132 onto the seed layer 140.

In another embodiment, the first portion 132 can be plated onto the seed layer 140 using an additive metal plating bath, while the nanoparticles 150 can be deposited onto the top surface 146 of the first portion with a metal plating bath containing no organic additives. In some examples, metal grain refiners can be included in the plating bath, provided that the grain refiners do not introduce a large amount of undesirable impurities in the plated layer or region of nanoparticles 150.

In some embodiments, the metal comprising the first portion 132 can be different from metal comprising the nanoparticles 150. For example, the first portion 132 can comprise a metal or alloy deposited using a copper, gold, or nickel plating bath, and the nanoparticles 150 can comprise a lower-melting-point material, for example, gallium, indium, tin, and/or their respective alloys.

In another embodiment, the nanoparticles 150 deposited on the opposing top surfaces 146 and 146' of the first and second portions 132, 134 can comprise the same metal or different metals. For example, nanoparticles 150 comprising tin or tin alloys can be deposited or coated onto the top surface 146 of the first portion 132, while nanoparticles 150 comprising indium, gallium, or their respective alloys can be deposited or coated onto the top surface 146' of the second portion 134.

In a particular embodiment, after depositing of the first portion 132 onto the seed layer 140 using an electrolytic process, for example, the first substrate 110 can be cleaned and transferred into an electroless plating bath to deposit the nanoparticles 150 onto the top surface 146 of the first portion. For example, during electroless plating of the nanoparticles 150, an initially-deposited layer or region of the nanoparticles can be smooth and non-particulate, but the metal reduction stage of the electroless plating may be catalytically enhanced to initiate the depositing of a non-planar layer or region of nanoparticles onto the initially-deposited layer or region. The non-planar deposition of the nanoparticles 150 can be continued for a sufficient time to deposit the desired total thickness of the nanoparticles.

In some applications, the electroless bath can be partially decomposed to generate nanoparticles 150 of a metal of interest. The generated nanoparticles 150 can selectively coat and adhere to the top surface 146 of the first portion 132. The unwanted particulate can be catalytically or oxidatively dissolved in another overflow in-process chamber, and the bath can be recycled to deposit more nanoparticles.

Figure 2E:
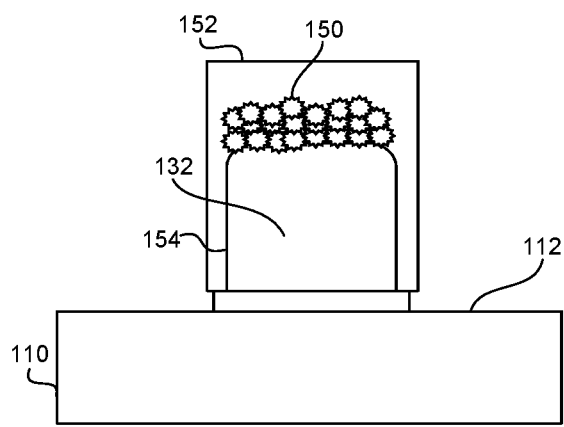

Next, as shown in FIG. 2E, the photoresist layer 142 may be removed, and then a dielectric protective mask 152 (e.g., a photoresist layer) may then be selectively deposited over the nanoparticles 150 and at least a portion of the sidewalls 154 of the first portion 132, to protect the nanoparticles and the first portions during removal of portions of the seed layer 140. The protective mask 152 may also extend over portions of the seed layer 140 where it is desired to have conductive traces extending along the major surface of the first substrate 110. In some embodiments, the protective mask 152 may not be needed. For example, in an embodiment in which the nanoparticles 150 comprises a material that is different from the material of the seed layer 140, the deposited layer of nanoparticles can be used as a protective mask for the first portion 132 during removal of the seed layer.

Then, the seed layer 140 may be removed at locations along the major surface 112 of the first substrate 110 where it is not desired to have conductive material (e.g., between adjacent ones of the first portions 132). After the excess portions of the seed layer 140 are removed, the protective mask 152 may be removed. In some embodiments, the portions of the seed layer 140 that are not removed may form part of the conductive column 130 that extends between the major surfaces 112 and 122.

Figure 2F:
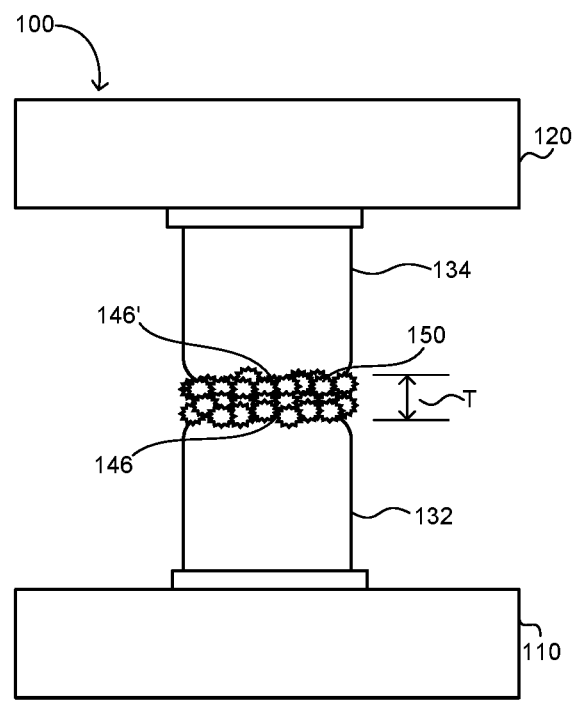

Then, as shown in FIG. 2F, the first portion 132 extending from the major surface 112 of the first substrate 110 may be joined with the second portion 134 extending from the major surface 122 of the second substrate 120. The second portion 134 may be formed using the same method steps shown and described with reference to FIGS. 2A-2E including application of the nanoparticles 150 thereon, or alternatively, the nanoparticles may be applied only to one of the first and second portions 132, 134 and not to the other portion.

To join the first portion 132 and the second portion 134 with one another, at least interfaces of the juxtaposed first and second portions of the assembly 100 may be heated to a temperature that is close to the joining or sintering temperature. Then, the first portion 132 and the second portion 134 are juxtaposed with one another, and the first and second portions can be aligned with one another in the first and second lateral directions.

Next, the first portion 132 and the second portion 134 can be brought into contact with one another, such that the nanoparticles 150 that were applied to one or both of the surfaces 146, 146' of the respective first and second portions can then join together to form a layer having a thickness T in the third direction D3 by up to 3 microns, or between 0.02 microns and 3 microns, or between 0.05 microns and 3 microns, for example. Therefore, the nanoparticles 350 can compensate for gaps or non-planarity between confronting corresponding surfaces 146, 146' of the respective first and second portions 132, 134. In one example, the surfaces 146 of the first portions 132 can at least partially confront the surfaces 146' of the second portion 134, the surfaces of at least some of the first portions being non-coplanar with respect to one another, and/or the surfaces of at least some of the second portions being non-coplanar with respect to one another.

Such gaps between the confronting corresponding top surfaces 146, 146' can be due to non-planarity among the top surfaces of a plurality or array of first portions 132 and/or non-planarity among the top surfaces of a corresponding plurality or array of second portions 134. In one example, during this juxtaposing step, the layer of nanoparticles 150 can be compressed by different distances among different ones of the juxtaposed first and second portions 132, 134, due to the non-planarity among the top surfaces of the first and second portions. In such an example, the thickness of the resulting bond region 136 can vary by up to 3 microns so as to accommodate the non-coplanarity of the top surfaces 146, 146' of at least some of the first and second portions 132, 134.

Then, at least interfaces of the juxtaposed first and second portions 132, 134 can be heated to a joining or sintering temperature, which preferably is below 200° C., more preferably below 180° C., or still more preferably below 150° C., at a relatively low pressure. During joining of the juxtaposed first and second portions 132, 134, an initial joining temperature can be below 100° C. before further heat processing at higher temperatures. At the joining temperature and sufficient pressure, the nanoparticles 150 may diffuse into both the first portion 132 and the second portion 134, thereby forming a metallurgical joint and joining the first and second portions together into a conductive column 130, as can be seen in FIG. 1.

Although the joining methods herein are described such that the top surfaces 146, 146' of the first and second portions 132, 134 are joined with one another, that need not be the case. In some examples, the edge surfaces or sidewalls 154 of the first and second portions 132, 134 may be joined to one another, or an edge surface of one of the first and second portions can be joined with a top surface of another one of the first and second portions. Also, although the joining top surfaces 146, 146' or edge surfaces 154 are shown as being planar, that need not be the case. Any or all of such top surfaces 146, 146' or edge surfaces 154 of one or both of the first and second portions 132, 134 to be joined can be planar or non-planar (e.g., convex, concave, non-linear, angled, multi-faceted, etc.).

In one example, one or both of the first and second portions 132, 134 can be formed on an electrically conductive trace or an electrically conductive pad at the major surface 112 and/or 122. In a particular embodiment, one or both of the first and second substrates 110, 120 can contain active and/or passive devices (e.g., capacitors, resistors, etc.) therein. In some embodiments, mechanical or optical elements (e.g., an optical cover) may be disposed over one or both of the first and second substrates 110, 120. The formed conductive column 130 can be used to perform electrical functions (e.g., carry signals or a reference potential), mechanical functions (e.g., absorb mechanical stress between the first and second substrates) and/or thermal functions (e.g., heat transfer purposes).

Figure 3:
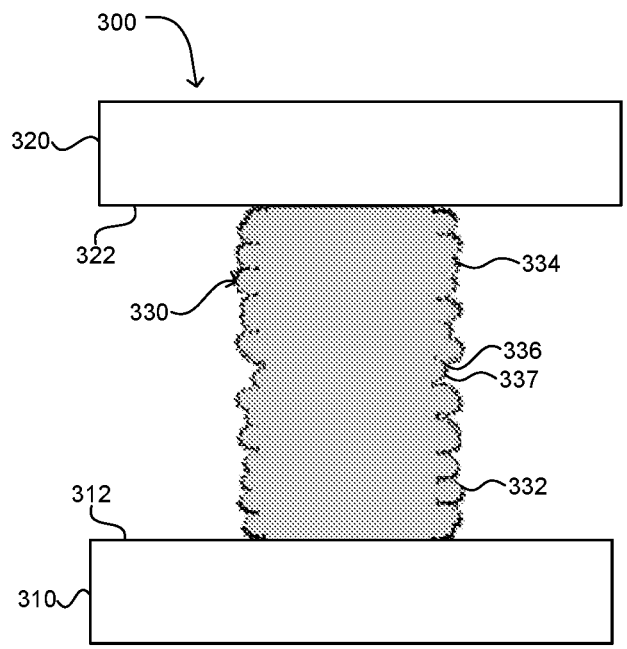
FIG. 3 is a diagrammatic side sectional view of an assembly according to an alternative embodiment of the assembly shown in FIG. 1.

FIG. 3 shows an assembly 300 that is a variation of the assembly 100 shown and described above with reference to FIG. 1. The assembly 300 is the same as the assembly 100 described above, except that the conductive column 330 has one or more scalloped or jagged sidewall surfaces 337 throughout the height of the column, showing structural evidence of nanoparticles deposited thereon, rather than having a scalloped or jagged sidewall surface located only in or adjacent the bond region 336. Also, as will be described below with reference to FIGS. 4B and 4C, the nanoparticles 350 are deposited onto the first and second portions 332, 334 by electroless or electrolytic deposition.

Figure 4A:
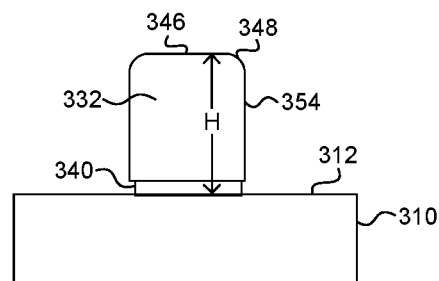
FIGS. 4A-4C are side sectional views illustrating stages of fabrication in accordance with the embodiment depicted in FIG. 3.
Figure 4B:
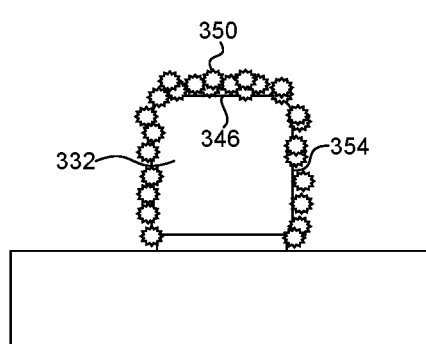
Figure 4C:
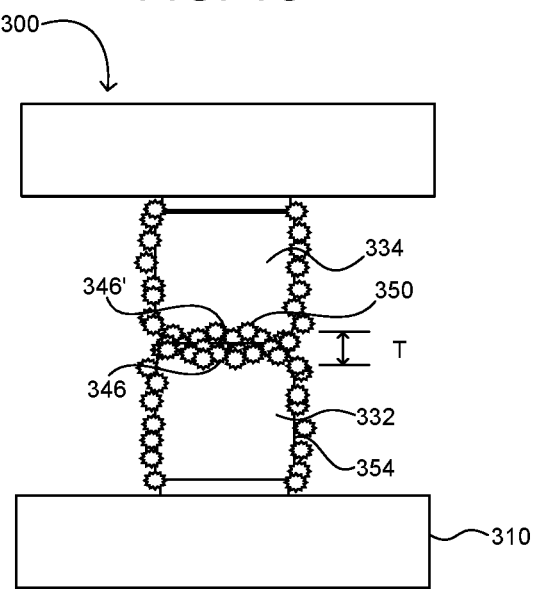

In the embodiment shown in FIGS. 3 through 4C, the nanoparticles 350 are deposited along portions of or the entire sidewalls 354 of the first and second portions 332, 334. Furthermore, the jagged surface 337 formed at the bond region 336 and at the sidewalls 354 may have a surface roughness that is greater than 5 nanometers.

A method of fabricating the assembly 300 (FIG. 3) will now be described, with reference to FIGS. 4A-4C. The method of fabricating the assembly 300 may begin in the same way as the method steps described above with reference to FIGS. 2A-2C. Next, referring to FIG. 4A, after the first portion 332 is formed, the photoresist layer 142 (FIG. 2C) may be removed.

Then, the seed layer 340 may be removed at locations along the major surface 312 of the first substrate 310 where it is not desired to have conductive material (e.g., between adjacent ones of the first portions 332). The portions of the seed layer 340 that are not removed may form part of the conductive column 330 that extends between the major surfaces 312 and 322.

Next, as shown in FIG. 4B, nanoparticles 350 are deposited onto the top surface 346 and sidewalls 354 of the first portion 332. In one example, the nanoparticles 350 can completely or substantially completely cover the top surface 346 and the edge surfaces or sidewalls 354 of the first portion 332. In this embodiment, the first portion 332 can be a unitary substantially rigid metal post or conductive pad or conductive trace, and the top surface 346 can project a height H (FIG. 4A) above the major surface 312 such that the top surface is remote from the major surface. The first portion 332 can define edge surfaces or sidewalls 354 extending at substantial angles away from the top surface 346.

In this example, the nanoparticles 350 are deposited by electroless or electrolytic deposition, in which the first portion 332 is exposed to an electroless or electroless plating bath to deposit the nanoparticles 350. The electroless deposition bath used to deposit the nanoparticles 350 onto the top surfaces 346 and sidewalls 354 of the first portion 332 may be the same bath or a different bath than the one that is used to deposit the metal of the first portion 332 onto the seed layer 340.

Then, as shown in FIG. 4C, the first portion 332 extending from the major surface 312 of the first substrate 310 may be joined with the second portion 334 extending from the major surface 322 of the second substrate 320. The second portion 334 may be formed using the same method steps shown and described with reference to FIGS. 4A and 4B including application of the nanoparticles 350 thereon, or alternatively, the nanoparticles may be applied only to one of the first and second portions 332, 334 and not to the other portion.

To join the first portion 332 and the second portion 334 with one another, at least interfaces of the juxtaposed first and second portions of the assembly 300 may be heated to a temperature that is close to the joining or sintering temperature. Then, the first portion 332 and the second portion 334 are juxtaposed with one another, and the first and second portions can be aligned with one another in the first and second lateral directions.

Next, the first portion 332 and the second portion 334 can be brought into contact with one another, such that the nanoparticles 350 that were applied to one or both of the top surfaces 346, 346' of the respective first and second portions can then join together to form a layer having a thickness T in the third direction D3 by up to 3 microns, or between 0.02 microns and 3 microns, or between 0.05 and 3 microns, for example. Therefore, the nanoparticles 350 can compensate for gaps between confronting corresponding top surfaces 346, 346' of the respective first and second portions 332, 334.

Then, at least interfaces of the juxtaposed first and second portions 332, 334 can be heated to a joining or sintering temperature, which preferably is below 200° C., more preferably below 180° C., or still more preferably below 150° C., at a relatively low pressure. During joining of the juxtaposed first and second portions 332, 334, an initial joining temperature can be below 100° C. before further heat processing at higher temperatures. At the joining temperature and sufficient pressure, the nanoparticles 350 may diffuse into both the first portion 332 and the second portion 334, thereby forming a metallurgical joint and joining the first and second portions together into a conductive column 330, as can be seen in FIG. 3.

Figure 6A:
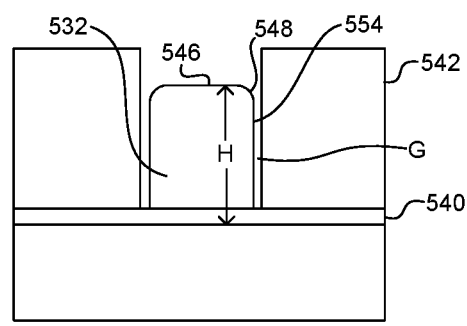
FIGS. 6A-6D are side sectional views illustrating stages of fabrication in accordance with the embodiment depicted in FIG. 5.

In a variation of a portion of the process described above with respect to FIGS. 4A and 4B, after the formation of the first portion 332, the photoresist layer 142 (FIG. 2C) may remain in place, rather than being removed. In such embodiments, portions of the first portion 332 or the photoresist layer 142 may be slightly etched or removed to form a small gap between sidewalls 354 of the first portion and the photoresist layer (e.g., such as the gap G shown in FIG. 6A). After the gap-formation step, the nanoparticles 350 can be deposited onto the top surface 346 and sidewalls 354 of the first portion 332 by the electroless or electrolytic methods described earlier. After the nanoparticles 350 are deposited, a mask (e.g., a mask such as a photoresist layer) may be deposited over the nanoparticles, and the photoresist layer 142 and portions of the seed layer 340 may be removed, thereby producing the structure shown in FIG. 4B.

In this embodiment having nanoparticles 350 deposited onto the top surfaces 346, 346' and edge surfaces or sidewalls 354 of the first and second portions 332, 334, it may be easier for the edge surfaces of the first and second portions to be joined to one another, or an edge surface of one of the first and second portions to be joined with a top surface of another one of the first and second portions. Thus, having nanoparticles 350 deposited onto the top surfaces 346, 346' edge surfaces or sidewalls 354 of the first and second portions 332, 334 may permit the corresponding first and second portions to be more misaligned with one another during the joining process than in embodiments without nanoparticles deposited onto the sidewalls of the first and second portions, since joints may be formed between edge surfaces of the first and second portions, or an edge surface of one of the first and second portions and a top surface of another one of the first and second portions.

Figure 5:
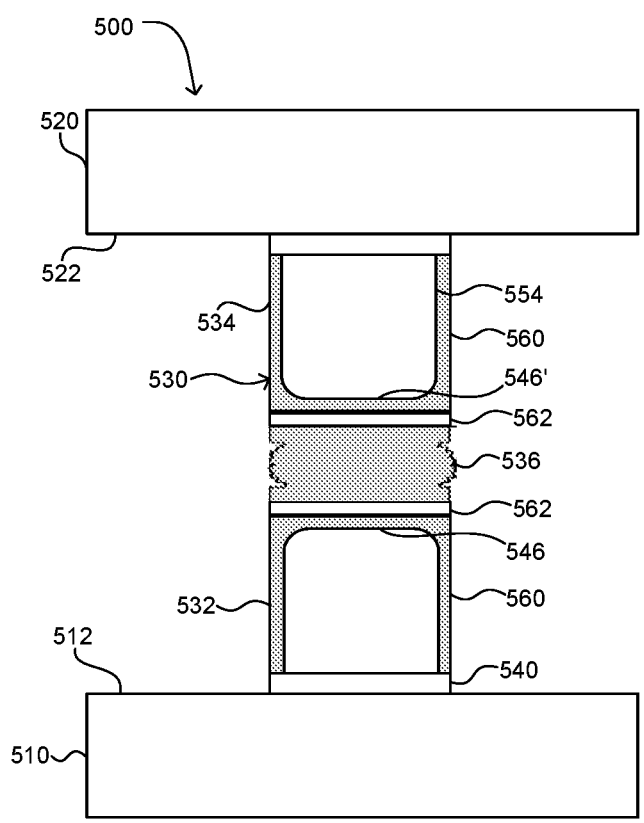
FIG. 5 is a diagrammatic side sectional view of an assembly according to another alternative embodiment of the assembly shown in FIG. 1.

FIG. 5 shows an assembly 500 that is a variation of the assembly 100 shown and described above with reference to FIG. 1. The assembly 500 is the same as the assembly 100 described above, except that an adhesion layer and/or a barrier layer 560 is deposited over the top surface 546, 546' and the sidewalls 554 of the first and second portions 532, 534, and a bond layer 562 and a wetting layer 564 are deposited overlying the top surface of the first and second portions before the nanoparticles 550 are deposited. The barrier layer 560 can have a thickness of less than 100 nanometers, for example.

In this embodiment, the nanoparticles 550 can comprise solder, so that bonding of the first and second portions 532, 534 can occur at a very low temperatures, for example, less than 120° C., and at a relatively low pressure or at atmospheric pressure. The use of solder as the nanoparticles 550 can permit rework of the assembly 500. For example, if the assembly 500 is heated above 120° C., the solder may sinter sufficiently to allow the first and second portions 532, 534 to be separated from one another, while the metal of the first and second portions, and the metal of the barrier layer 560 and the bond layer 562 may remain solid. New nanoparticles 550 can then be applied to the first and second portions 532, 534, and the first and second portions can be rejoined.

A method of fabricating the assembly 500 (FIG. 5) will now be described, with reference to FIGS. 6A-6D. The method of fabricating the assembly 500 may begin in the same way as the method steps described above with reference to FIGS. 2A and 2B. Next, referring to FIG. 6A, the first portion 532 or a portion of the mask or photoresist layer 542 can be partially etched, defining a top surface 546 generally facing in the third direction (FIG. 1) that may have a rounded peripheral edge 548.

The etching of the first portion 532 may also proceed along the sidewalls 554 from the top surface 546 to the seed layer 540, defining a gap G between the sidewalls and the photoresist layer 542. In one example, the gap G may extend along the entire height of the sidewalls 554, exposing a portion of the seed layer 540 within the gap. In another example, the gap G may extend along only a portion of the height of the sidewalls 554, not extending down to the seed layer 540. In yet another example, the gap G may extend along the entire height of the sidewalls 554 and partially or entirely through the seed layer 540. In this embodiment, the first portion 532 can be a unitary substantially rigid metal post or conductive pad or conductive trace, and the top surface 546 can project a height H above the major surface 512 such that the top surface is remote from the major surface. The first portion 532 can define edge surfaces or sidewalls 554 extending at substantial angles away from the top surface 546.

Figure 6B:
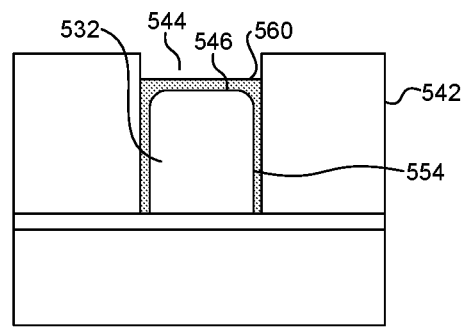

Then, as shown in FIG. 6B, a barrier layer 560 is deposited within the opening 544 of the photoresist layer 542, over the top surface 546 and the sidewalls 554 of the first portion 532. In one example, the barrier layer 560 can completely cover the top surface 546 and the edge surfaces or sidewalls 554 of the first portion 532.

Examples of metals that can be suitable for use in the barrier layer 560 can include nickel, tungsten, titanium nitride, tantalum nitride, tantalum silicon nitride, tantalum, tungsten silicon nitride, an alloy including nickel, and combinations thereof. The barrier layer 560 can prevent metal from the nanoparticles 550 (e.g., solder) from diffusing into the metal material of the first portion 532 (e.g., copper).

Figure 6C:
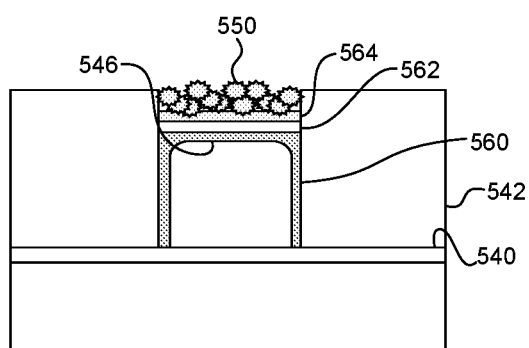

Next, referring to FIG. 6C, a bond layer 562 and a wetting layer 564 can be deposited overlying the top surface 546 of the first portion 532. The bond layer 562 can be deposited onto a surface of the barrier layer 560. The bond layer 562 can comprise gold, for example. The wetting layer 564 can be deposited overlying the bond layer 562. The wetting layer can comprise solder, for example. In some examples, the bond layer 562 and the wetting layer 564 can be the same material, or can comprise similar materials or alloys of similar materials.

Then, nanoparticles 550 are deposited onto the wetting layer 564. In this example, the nanoparticles 550 are deposited by electrolytic deposition, in which the first portion 532 is exposed to an electrolytic bath at a current density greater than 50 mA/cm$^2$, so as to cause depletion of the plating bath. As described above, the nanoparticles 550 may comprise solder or one or more bond metals such as tin, indium, bismuth, or a combination of two or more of such bond metals.

Next, the photoresist layer 542 may be removed, and then a dielectric protective mask may then be selectively deposited over the first portion 532, to protect the nanoparticles and the first portions during removal of portions of the seed layer 540, as shown an described above with reference to FIG. 2E. Then, the seed layer 540 may be removed at locations along the major surface 512 of the first substrate 510 where it is not desired to have conductive material (e.g., between adjacent ones of the first portions 532). After the excess portions of the seed layer 540 are removed, the protective mask may be removed.

Figure 6D:
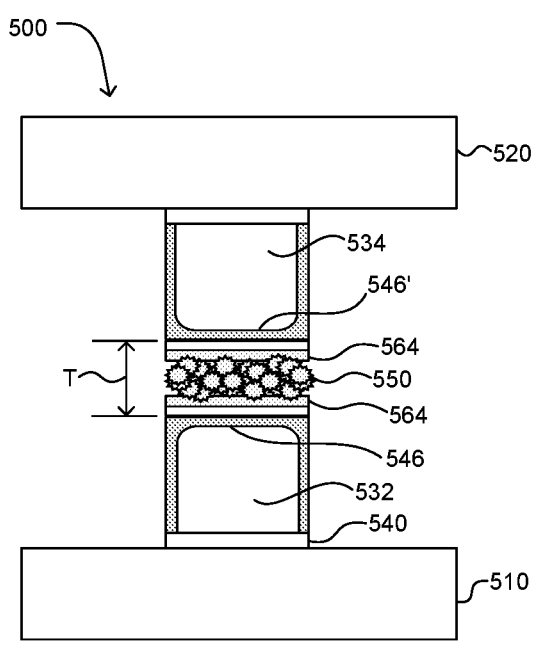

Then, as shown in FIG. 6D, the first portion 532 extending from the major surface 512 of the first substrate 510 may be joined with the second portion 534 extending from the major surface 522 of the second substrate 520. The second portion 534 may be formed using the same method steps shown and described with reference to FIGS. 6A-6C including application of the nanoparticles 550 thereon, or alternatively, the nanoparticles may be applied only to one of the first and second portions 532, 534 and not to the other portion.

To join the first portion 532 and the second portion 534 with one another, at least interfaces of the juxtaposed first and second portions of the assembly 500 may be heated to a temperature that is close to the joining or sintering temperature. Then, the first portion 532 and the second portion 534 are juxtaposed with one another, and the first and second portions can be aligned with one another in the first and second lateral directions.

Next, the first portion 532 and the second portion 534 can be brought into contact with one another, such that the nanoparticles 550 that were applied to one or both of the top surfaces 546, 546' of the respective first and second portions can then join together to form a layer having a thickness T in the third direction D3 by up to 3 microns, or between 0.5 microns and 3 microns, for example. Therefore, the nanoparticles 550 can compensate for gaps between confronting corresponding top surfaces 546, 546' of the respective first and second portions 532, 534.

Then, at least interfaces of the juxtaposed first and second portions 532, 534 can be heated to a joining or sintering temperature, which preferably is below 120° C., at a relatively low pressure. At the joining temperature and sufficient pressure, the nanoparticles 550 may diffuse into the wetting layers 564 of both the first portion 532 and the second portion 534, thereby forming a bond region 536 from the nanoparticles and the wetting layers, and forming a metallurgical joint and joining the first and second portions together into a conductive column 530, as can be seen in FIG. 5. In one example, the bond region 536 can be located between the barrier layer 560 of the first portion 532 and the top surface 546' of the corresponding second portion 534.

FIG. 7 shows an assembly 700 that is a variation of the assembly 500 shown and described above with reference to FIG. 5. The assembly 700 is the same as the assembly 500 described above, except the bond layer is omitted, and the wetting layer 764 is deposited directly onto the barrier layer 760 before the nanoparticles 750 are deposited. In this embodiment, the wetting layer 764 and the nanoparticles 750 can each comprise gold, for example.

A method of fabricating the assembly 700 (FIG. 7) will now be described, with reference to FIGS. 8A and 8B. The method of fabricating the assembly 700 may begin in the same way as the method steps described above with reference to FIGS. 2A, 2B, 6A, and 6B. Next, referring to FIG. 8A, a wetting layer 764 can be deposited overlying the top surface 746 of the first portion 732. The wetting layer 564 can be deposited overlying the bond layer 562. The wetting layer can comprise gold and/or palladium, for example.

Then, nanoparticles 750 are deposited onto the wetting layer 764. In this example, the nanoparticles 750 are deposited by electrolytic deposition, in which the first portion 732 is exposed to an electrolytic bath at a current density greater than 50 mA/cm$^2$, so as to cause depletion of the plating bath. As described above, the nanoparticles 750 may comprise gold.

Next, the photoresist layer 742 may be removed, and then a dielectric protective mask may then be selectively deposited over the first portion 732, as described above with reference to FIG. 2E. Then, the seed layer 740 may be removed at locations along the major surface 712 of the first substrate 710 where it is not desired to have conductive material (e.g., between adjacent ones of the first portions 732). After the excess portions of the seed layer 740 are removed, the protective mask may be removed.

Then, as shown in FIG. 8B, the first portion 732 extending from the major surface 712 of the first substrate 710 may be joined with the second portion 734 extending from the major surface 722 of the second substrate 720. The second portion 734 may be formed using the same method steps shown and described with reference to FIGS. 2A, 2B, 6A, 6B, and 8A including application of the nanoparticles 750 thereon, or alternatively, the nanoparticles may be applied only to one of the first and second portions 732, 734 and not to the other portion.

To join the first portion 732 and the second portion 734 with one another, at least interfaces of the juxtaposed first and second portions of the assembly 700 may be heated to a temperature that is close to the joining or sintering temperature. Then, the first portion 732 and the second portion 734 are juxtaposed with one another, and the first and second portions can be aligned with one another in the first and second lateral directions.

Next, the first portion 732 and the second portion 734 can be brought into contact with one another, such that the nanoparticles 750 that were applied to one or both of the top surfaces 746, 746' of the respective first and second portions can then join together to form a layer having a thickness T in the third direction D3 by up to 3 microns, or between 0.5 microns and 3 microns, for example. Therefore, the nanoparticles 750 can compensate for gaps between confronting corresponding top surfaces 746, 746' of the respective first and second portions 732, 734.

Then, at least interfaces of the juxtaposed first and second portions 732, 734 can be heated to a joining or sintering temperature, which preferably is below 200° C., more preferably below 180° C., or still more preferably below 150° C., at a relatively low pressure. During joining of the juxtaposed first and second portions 732, 734, an initial joining temperature can be below 100° C. before further heat processing at higher temperatures. At the joining temperature and sufficient pressure, the nanoparticles 750 may diffuse into the wetting layers 764 of both the first portion 732 and the second portion 734, thereby forming a bond region 736 from the nanoparticles and the wetting layers, and forming a metallurgical joint and joining the first and second portions together into a conductive column 730, as can be seen in FIG. 7. In one example, the bond region 736 can be located between the barrier layer 760 of the first portion 732 and the top surface 746' of the corresponding second portion 734.

Although the embodiments of FIGS. 1, 3, 5, and 7 were shown and described as having first and second conductive portions 132/332/532/732 and 134/334/534/734 that each are a unitary substantially rigid metal post defining a top surface and edge surfaces or sidewalls extending at substantial angles away from the top surface, that need not be the case.

In some examples, in any of the embodiments described above, either or both of the first and second conductive portions 132/332/532/732 and 134/334/534/734 can be a thin, thin, flat pad of metal, or a metal trace, comprising a material such as copper, aluminum, gold, nickel, or tungsten, deposited with a bottom surface thereof facing the major surface of the respective first or second substrate. For example, referring to FIG. 1, the first conductive portion 132 can be in the form of the first conductive element 131, and the nanoparticles 150 can be deposited directly onto a top surface of the first conductive element, and/or the second conductive portion 134 can be in the form of the second conductive element 133, and the nanoparticles can be deposited directly onto a top surface of the second conductive element. Examples of embodiments having first and second conductive portions that include one or more portions that are not rigid metal posts are shown and described below with reference to FIGS. 9-16.

In some embodiments, the first portions 132/332/532/732 and/or the second portions 134/334/534/734 can be a conductive layer or region conformally or non-conformally deposited into a recess extending below the respective major surface 112/312/512/712 and/or 122/322/522/722, and the first and/or second conductive portions 132/332/532/732 and 134/334/534/734 may or may not fill its respective recess. The nanoparticles 150/350/550/750 can be deposited onto an exposed surface of such a deposited layer or region, and the nanoparticles can be deposited onto a top surface facing away from the respective major surface. Similar to the embodiment of FIGS. 5 through 6D, an adhesion layer and/or a barrier layer can be deposited onto such a deposited layer or region, and the nanoparticles 150/350/550/750 can be deposited onto the adhesion layer and/or the barrier layer. Examples of embodiments having first and/or second conductive portions deposited into recesses are shown and described below with reference to FIGS. 9-16.

In a particular example where the first portions 132/332/532/732 and the second portions 134/334/534/734 are deposited into a recess extending below the respective major surface 112/312/512/712 and/or 122/322/522/722, the first and second portions can each extend to approximately the plane of the respective major surface, and the nanoparticles 150/350/550/750 can be deposited onto a top surface of the first portion and/or second portion. In such an example, when the first and second substrates 110/310/510/710, 120/320/520/720 are joined together by the nanoparticles, the major surfaces 112/312/512/712 and 122/322/522/722 may be touching each other or almost touching each other. Examples of embodiments having major surfaces of the first and second substrates touching each other or almost touching each other are shown and described below with reference to FIGS. 9-16.

Figure 9:
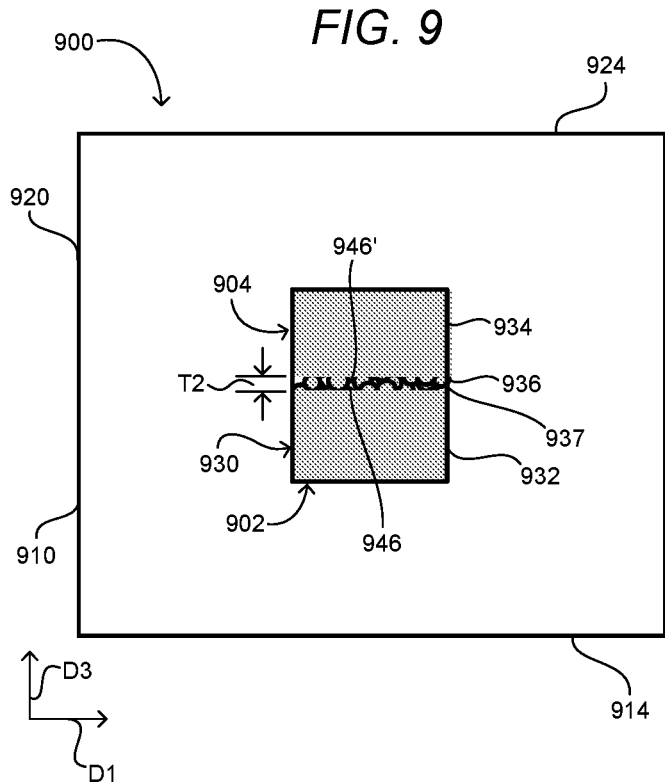
FIG. 9 is a diagrammatic side sectional view of an assembly according to an embodiment of the present invention.

FIG. 9 shows an assembly 900 that is a variation of the assembly 100 shown and described above with reference to FIG. 1. The assembly 900 is the same as the assembly 100 described above, except that the joined conductive structure 930 extends into recesses, rather than including two conductive posts. Also, dielectric material of the substrates 910 and 920 are fused to one another along the first and major surfaces, rather than being spaced apart.

Figure 10A:
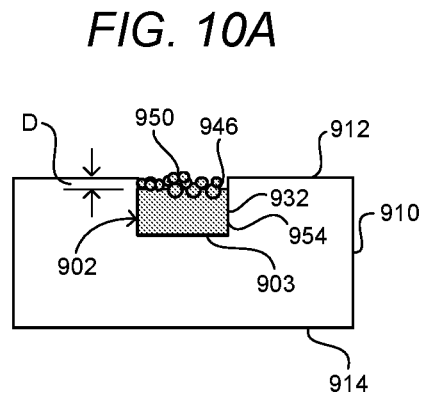
FIGS. 10A-10C are side sectional views illustrating stages of fabrication in accordance with the embodiment depicted in FIG. 9.
Figure 10B:
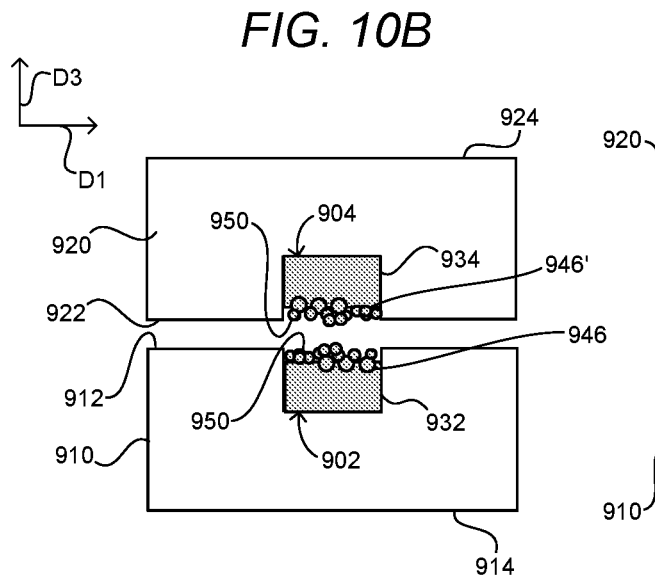
Figure 10C:
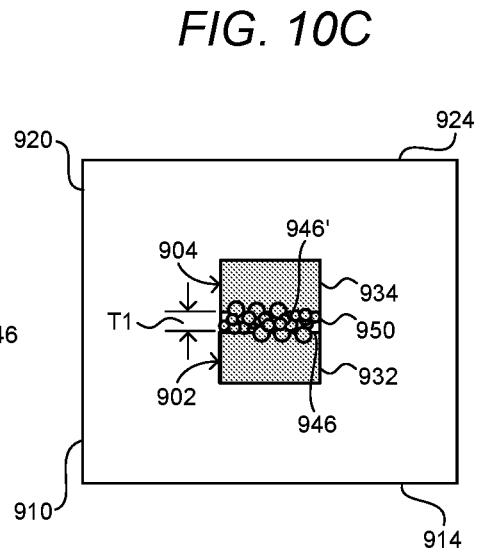

As illustrated in FIG. 9 through 10C, an assembly 900 can include a first substrate 910 having a major surface 912 extending in a first direction D1 and in a second direction transverse to the first direction, a second substrate 920 having a major surface 922 extending in the first and second directions, and a conductive structure 930 extending in a third direction D3 transverse to the first and second directions, the structure including an electrical connection between conductive elements 932 and 934 at the major surface 912 and the major surface 922, respectively. Although only a single structure 930 is shown and described with reference to FIG. 9, it is to be understood that the first and second substrates 910, 920 may be joined by an m×n array of conductive structures, one or both of m and n being greater than one. The structure 930 (and the other conductive structures described herein) may be used, for example, to carry signals or information, power, heat, or a reference potential, between the first substrate 910 and the second substrate 920.

In some embodiments, one or both of the substrates 910 and 920 can be a semiconductor chip, a wafer, glass, ceramic, glass-ceramic, a polymer, a substrate, a microelectronic package, composite material, a flat panel, or the like, and combinations thereof. One or both of the substrates 910 and 920 may consist essentially of an inorganic material such as silicon. The thickness of one or both of the substrates 910 and 920 between its major surface and a respective second surface 914 or 924 opposite to the major surface can be less than 500 μm, and can be significantly smaller, for example, 930 μm, 70 μm or even smaller.

In some embodiments, one or both of the substrates 910 and 920 can be made from a material such as semiconductor material, ceramic, glass, liquid crystal material, a composite material such as glass-epoxy or a fiber-reinforced composite, a laminate structure, or a combination thereof. In some embodiments, one or both of the substrates 910 and 920 can be a supporting dielectric element, e.g., a tape used in tape automated bonding ("TAB"). In one example, one or both of the substrates 910 and 920 can consist essentially of a dielectric element having a coefficient of thermal expansion in a plane of the substrate of less than 90 ppm/° C. In a particular embodiment, the substrate 902 can consist essentially of a dielectric element having a coefficient of thermal expansion in a plane of the substrate of between about 90 and about 20 ppm/° C. In one particular embodiment, one or both of the substrates 910 and 920 can consist essentially of a dielectric element having a coefficient of thermal expansion in a plane of the substrate of between about 90 and about 20 ppm/° C. and an out-of-plane coefficient of thermal expansion between about 95 and about 60 ppm/° C. In one example, one or both of the substrates 910 and 920 can have a Young's modulus of less than 4 GPa. In exemplary embodiments, one or both of the substrates 910 and 920 can have a Young's modulus of less than 100 GPa.

One or both of the substrates 910 and 920 can further include an insulating dielectric layer (not shown) overlying the respective major surface 912 or 922 and/or the respective second surface 914 or 924. Such dielectric layers can electrically insulate conductive elements such as the structure 930 from the substrate, when the substrate comprises an electrically conductive material or a semiconductor material. These dielectric layers can be referred to as "passivation layers" of the substrate. Such dielectric layers can include an inorganic or organic dielectric material or both. Such dielectric layers can include an electrodeposited conformal coating or other dielectric material, for example, a photoimageable polymeric material, for example, a solder mask material.

One or both of the substrates 910 and 920 can further include conductive structure therein, such as the conductive structure 116, 126 shown in FIG. 1. Such conductive structure can include traces extending along one or both of the major and second surfaces, conductive interconnects or conductive vias extending between or in a direction between the respective major surface 912 or 922 and/or the respective second surface 914 or 924, and terminals such as the terminals 118, 128 shown in FIG. 1 at the respective second surface for electrical connection with a component external to the assembly 900.

In embodiments where one or both of the substrates 910 and 920 include a semiconductor substrate, made for example from silicon, one or a plurality of semiconductor devices (e.g., transistors, diodes, etc.) can be disposed in an active device region thereof located at and/or below the respective major surface 912 or 922. In one example, an active device region of one or both of the substrates 910 and 920 can be electrically connected with the corresponding first and second conductive elements 932 and 934.

The conductive structure 930 can include a first electrically conductive element or portion 932 at the major surface 912 of the first substrate 910 and a second electrically conductive element or portion 934 at the major surface 922 of the second substrate 920. Each of the first and second portions 932, 934 can be a metal region disposed within a corresponding recess 902, 904 extending below the respective major surface 912 or 922 in the third direction D3 or in a direction opposite the third direction.

The first and second portions 932, 934 can each include a conductive material such as copper, aluminum, tungsten, solder, lead, tin, gallium, gold, nickel, indium, silver, an alloy including copper, an alloy including nickel, an alloy including tungsten, or a combination of one or more of the aforementioned materials, among others. In one example, each of the first and second portions 932, 934 can consist essentially of copper. The first and second portions 932, 934 can each comprise the same metal, or the first portion may comprise a different metal than the second portion. In some embodiments, one or both of the first and second portions 932, 934 can comprise a barrier layer or barrier material.

The conductive structure 930 can include a bond region 936 that can include structural evidence of nanoparticles having been joined together in a prior bonding operation. The bond region 936 may or may not comprise any remaining liquid, e.g., surfactant or solvent. In one example, the bond region 936 can penetrate at least partially into each of the first and second portions 932, 934. Such nanoparticles can also be arranged as dendritic deposits at one or more surfaces of metal regions that can comprise the first and second portions 932, 934 of the conductive structure 930.

In one example, the bond region 936 can include a layer of nanoparticles consisting essentially of at least one of copper, gold, nickel, silver, alloys including silver, gallium, indium, alloys of gallium or indium, tin, bismuth, eutectic metal alloys, another metal, or a combination of metals. The nanoparticles can be coated with a very thin protective or non-protective layer of material (e.g., gallium, indium, tin, nickel), and the protective layer can be continuous or discontinuous. Such a protective or non-protective layer of material can lower the melting point of the nanoparticles. In one example, nanoparticles deposited onto the first potion 932 can be coated with gallium, and nanoparticles deposited onto the second portion 934 can be coated with indium, which can lower the melting point of the nanoparticles. Such a protective or non-protective layer of material can have a thickness of 5-10 nanometers, for example. Further details about such a protective or non-protective layer of material on nanoparticles can be found in U.S. Pat. No. 9,024,205, which is hereby incorporated herein by reference.

Joining the first and second substrates 910, 920 together at a lower temperature (e.g., less than 200° C.) compared to that of conventional joining techniques can improve the structure of the final assembly 900, and can also benefit the process of making the assembly, which can improve yield and efficiency, thereby reducing fabrication cost. Typically, first and second portions 932, 934 (e.g., in the form of electrically conductive metal regions) of each substrate 910, 920 are juxtaposed in alignment with one another at a temperature just below the joining temperature. Then, the aligned posts are moved into contact with one another, and the assembly is heated to the joining temperature, at which time the nanoparticles on the respective first and second portions 932, 934 bond, such that the structures 930 form. In some embodiments, the nanoparticle regions between the substrates can fuse at room temperature when the mating regions touch. Subsequent higher-temperature processing can serve to improve both the mechanical and electrical integrity of the room-temperature joint. The substrate joining ambient environment can be inert, reducing, or a vacuum. In some applications, metallic oxide reducing fluids can be flowed around the substrates during the joining operation. In one embodiment, the fluid in the joining chamber can comprise a compound that enhances grain growth or grain growth rate in metals, for example, alcohol dispersed in an inert gas such as nitrogen.

After the first and second portions 932, 934 are joined together by nanoparticles or nanomaterials in any form, the bond region 936 that joins the first and second portions together can show structural evidence that nanoparticles were used to join the first and second portions. For example, during joining of the first and second portions 932, 934, nanoparticles can diffuse into the first and second portions.

After joining, the metal formerly comprising the nanoparticles are no longer in the form of clusters of nanoparticles having long dimensions typically smaller than about 100 nanometers.

The bond region 936 that joins the first and second portions 932, 934 together can show other structural evidence that nanoparticles were used to join the first and second portions, including the contour of the surface of the bond region. The bond region 936 may have a scalloped or jagged surface 937 that generally extends in a circumferential direction about the structure 930. The surface 937 of the bond region 936 may have a higher degree of surface roughness than the surface roughness of the first and second portions 932, 934. For example, the surface 937 may have a surface roughness that is greater than 30 nanometers. In one example, the surface 937 may have a surface roughness that is greater than 3.0 nanometers. Another example of structural evidence that nanoparticles were used to join the first and second portions 932, 934 can be the presence of microvoids within the bond region 936. Such structural evidence of microvoids can be the same as described above with reference to the assembly 100.

In embodiments in which the first and second substrates 910, 920 are joined by an array of conductive structures 930, the thickness T2 of the bond region 936 in the third direction D3 may vary among the array of conductive structures by up to 3 microns, or between 0.5 microns and 3 microns, for example. The variation in the thickness of the bond regions 936 among the conductive structures 930 may be due to non-planarity among the top surfaces of an array of first portions 932 and/or non-planarity among the top surfaces of a corresponding array of second portions 934 before the corresponding first and second portions are joined to one another, as will be described below. In one embodiment, one of the first and second portions 932, 934 can be an electrically conductive trace or an electrically conductive pad (e.g., a flat piece of metal in the shape of a circle, oval, square, or rectangle). Thus, nanomaterials can be used to attach a conductive post to a conductive trace or a conductive pad at the major surface 912 or 922.

A method of fabricating the assembly 900 (FIG. 9) will now be described, with reference to FIGS. 10A-10C. Referring to FIG. 10A, one or more recesses 902 may be formed extending below the major surface 912 in a direction opposite the third direction D3. The recess 902 may be etched or formed using any other method known in the art. To control the location of one or more recess 902, a photoimageable layer such as a photoresist layer can be deposited and patterned to cover only portions of the major surface 912. The photoresist layer can have openings at locations along the major surface 912 where it is desired to form structures 930.

After the recess 902 is formed, a continuous metal seed layer (e.g., copper) may be deposited into the recess, or onto a dielectric layer overlying inner surfaces 903 of the recess if the substrate comprises an electrically conductive material or a semiconductor material. The seed layer can be deposited by various methods, including atomic layer deposition (ALD), physical vapor deposition (PVD), or electroless or electrolytic deposition methods. The seed layer can comprise copper, for example. The seed layer can also include an adhesion layer, a barrier layer, or both.

After the seed layer is formed, the same or a different photoimageable layer such as a photoresist layer can be deposited and patterned to cover only portions of the major surface 912. The photoresist layer can have openings at locations along the major surface 912 where it is desired to form structures 930.

Then, as shown in FIG. 10A, the first portion 932 of the structure 930 can be formed by depositing one or more conductive materials (e.g., copper) into the recesses 902 in contact with the seed layer. In this example, the first portion 932 is deposited by electrolytic deposition. The first portion 932 can extend from the seed layer in the third direction D3.

Next, the first portion 932 can be partially etched, defining a top surface 946 of the first portion generally facing in the third direction D3 that may have a rounded peripheral edge (similar to the rounded peripheral edge 148 shown in FIG. 2C). This partial or mild etching step can expose high-index metal planes to permit the nanoparticles to nucleate. The first portion 932 can be a unitary substantially rigid metal region, and the top surface 946 can be recessed a distance D below the major surface 912. The first portion 932 can define edge surfaces or sidewalls 954 extending at substantial angles away from the top surface 946.

Then, nanoparticles 950 can be deposited onto the top surface 946 of the first portion 932. In this example, the nanoparticles 950 are deposited by electrolytic deposition, in which the first portion 932 is exposed to an electrolytic bath at a current density greater than 50 mA/cm$^2$, so as to cause local depletion of metal ions at the top surface 946 during the plating step.

In one embodiment, after plating the first portion 932 onto the seed layer, the plating current density or voltage can be increased momentarily beyond the mass transport limit of the plating bath formulation. High current pulse plating can be employed to form the nanoparticles 950. The plating condition can be chosen to generate a layer or region of nanoparticles 950 without incorporating undesirable impurities within the layer or region.

For example, to plate the first portion 932 onto the seed layer, a copper plating bath containing organic additives, suppressors, brighteners, levelers, or various combinations thereof, can be used, with current densities between 10 and 40 mA/cm$^2$. Preferably, plating can be performed at current densities below the mass transport limit of the bath formulation, for a sufficient time to permit the first portion to be plated up to the height shown in FIG. 10A.

To initiate depositing of the nanoparticles 950 onto the top surface 946, the plating current density can then be momentarily increased beyond the mass transport limit of the bath. The nanoparticles 950 can be deposited onto the top surface 946 by cycling the plating current density above and below the mass transport limit of the plating bath chemistry. In one example, the process of depositing the nanoparticles 950 onto the top surface 946 can comprise plating for 3 to 15 milliseconds above the mass transport limit and plating for 20 to 50 milliseconds below the mass transport limit of the plating bath. The electrolytic deposition bath used to deposit the nanoparticles 950 onto the top surface 946 of the first portion 932 may be the same bath or a different bath than the one that is used to deposit the metal of the first portion onto the seed layer.

In another embodiment, the first portion 932 can be plated onto the seed layer using an additive metal plating bath, while the nanoparticles 950 can be deposited onto the top surface 946 of the first portion with a metal plating bath containing no organic additives. In some examples, metal grain refiners can be included in the plating bath, provided that the grain refiners do not introduce a large amount of undesirable impurities in the plated layer or region of nanoparticles 950.

In some embodiments, the metal comprising the first portion 932 can be different from metal comprising the nanoparticles 950. For example, the first portion 932 can comprise a metal or alloy deposited using a copper, gold, or nickel plating bath, and the nanoparticles 950 can comprise a lower-melting-point material, for example, gallium, indium, tin, and/or their respective alloys.

In another embodiment, the nanoparticles 950 deposited on the opposing top surfaces 946 and 946' of the first and second portions 932, 934 can comprise the same metal or different metals. For example, nanoparticles 950 comprising tin or tin alloys can be deposited or coated onto the top surface 946 of the first portion 932, while nanoparticles 950 comprising indium, gallium, or their respective alloys can be deposited or coated onto the top surface 946' of the second portion 934.

In a particular embodiment, after depositing of the first portion 932 into the recess 902 using an electrolytic process, for example, the first substrate 910 can be cleaned and transferred into an electroless plating bath to deposit the nanoparticles 950 onto the top surface 946 of the first portion. For example, during electroless plating of the nanoparticles 950, an initially-deposited layer or region of the nanoparticles can be smooth and non-particulate, but the metal reduction stage of the electroless plating may be catalytically enhanced to initiate the depositing of a non-planar layer or region of nanoparticles onto the initially-deposited layer or region. The non-planar deposition of the nanoparticles 950 can be continued for a sufficient time to deposit the desired total thickness of the nanoparticles.

In some applications, the electroless bath can be partially decomposed to generate nanoparticles 950 of a metal of interest. The generated nanoparticles 950 can selectively coat and adhere to the top surface 946 of the first portion 932. The unwanted particulate can be catalytically or oxidatively dissolved in another overflow in-process chamber, and the bath can be recycled to deposit more nanoparticles.

Next, any remaining photoresist layer may be removed, and remaining portions of the seed layer on the major surface 912 may be removed using method similar to those described above with reference to FIG. 2E. During removal of portions of the seed layer, a dielectric mask can be used to cover portions of the seed layer where it is desired to have conductive traces extending along the major surface 912.

Then, as shown in FIGS. 10B and 10C, the first portion 932 extending within the recess 902 of the first substrate 910 may be joined with the second portion 934 extending within the recess 904 of the second substrate 920. The second portion 934 may be formed within a recess 904 extending below the major surface 922 of the second substrate 920 using the same method steps described with reference forming the first portion 932, including application of the nanoparticles 950 thereon, or alternatively, the nanoparticles may be applied only to one of the first and second portions 932, 934 and not to the other portion.

To join the first portion 932 and the second portion 934 with one another, at least interfaces of the juxtaposed first and second portions of the assembly 900 may be heated to a temperature that is close to the joining or sintering temperature. Then, the first portion 932 and the second portion 934 are juxtaposed with one another, and the first and second portions can be aligned with one another in the first and second lateral directions.

Next, the first portion 932 and the second portion 934 can be brought into contact with one another, such that the nanoparticles 950 that were applied to one or both of the surfaces 946, 946' of the respective first and second portions can then join together to form a layer having a thickness T1 in the third direction D3 by up to 3 microns, or between 0.02 microns and 3 microns, or between 0.05 microns and 3 microns, for example. Therefore, the nanoparticles 350 can compensate for gaps and/or non-planarity between confronting corresponding surfaces 946, 946' of the respective first and second portions 932, 934. In one example, the surfaces 946 of the first portions 932 can at least partially confront the surfaces 946' of the second portion 934, the surfaces of at least some of the first portions being non-coplanar with respect to one another, and/or the surfaces of at least some of the second portions being non-coplanar with respect to one another. Any or all of such top surfaces 946, 946' of one or both of the first and second portions 932, 934 to be joined can be planar or non-planar (e.g., convex, concave, non-linear, angled, multi-faceted, etc.).

In one example, during this juxtaposing step, the layer of nanoparticles 950 can be compressed by different distances among different ones of the juxtaposed first and second portions 932, 934, due to the non-planarity among the top surfaces of the first and second portions. In such an example, the thickness of the resulting bond region 936 can vary by up to 3 microns so as to accommodate the non-coplanarity of the top surfaces 946, 946' of at least some of the first and second portions 932, 934.

Then, at least interfaces of the juxtaposed first and second portions 932, 934 can be heated to a joining or sintering temperature, which preferably is below 200° C., more preferably below 180° C., or still more preferably below 150° C., at a relatively low pressure. During joining of the juxtaposed first and second portions 932, 934, an initial joining temperature can be below 100° C. before further heat processing at higher temperatures. At the joining temperature and sufficient pressure, the nanoparticles 950 may diffuse into both the first portion 932 and the second portion 934, thereby forming a metallurgical joint and joining the first and second portions together into a conductive structure 930, as can be seen in FIG. 10C.

In one example, the major surfaces 912 and 922 can be juxtaposed with one another before the temperature of the devices is raised to a temperature at which the first and second portions 932, 934 are joined. The major surfaces 912 and 922 can comprise a dielectric adhesive material and/or a partially cured B-stage polymer material, such that before heating of the assembly 900 or during heating of the assembly 900, the major surfaces are directly bonded with one another. In a particular embodiment, the first and second substrates 910, 920 are juxtaposed with one another so that the major surfaces 912, 922 directly bond with one another, and such that the first portions 932 confront the second portions 934. This juxtaposing may be performed at an initial temperature, which may be room temperature or a relatively low temperature. In one example, the dielectric material at the major surfaces 912, 922 can each include a B-stage material layer that is not fully cured, and when the temperature of the assembly 900 is raised, the B-stage material layers can be fully cured, thereby directly bonding the major surfaces to one another.

Then, after the major surfaces 912, 922 are bonded to one another, the assembly 900 can be raised to a higher joining temperature so that the nanoparticles 950 may diffuse into both the first portion 932 and the second portion 934, thereby forming a metallurgical joint and joining the first and second portions together into a conductive structure 930. During the joining of the major surfaces 912, 922 and/or during joining of the first and second portions 932, 934, the assembly 900 may also be subject to increased pressure.

After the major surfaces 912, 922 are bonded to one another and the first and second portions 932, 934 are bonded to one another, the thickness of the bond region 936 in the third direction D3 may decrease from T1 (FIG. 10C) to T2 (FIG. 9), thereby bringing the confronting surfaces 946, 946' of the respective first and second portions 932, 934 closer to one another, as shown in FIG. 9. This reduction in the thickness of the bond region 936 in the third direction D3 can be caused by cross-linking of polymers between the major surfaces 912, 922 when the major surfaces are bonded together and/or fully cured together.

In one example, one or both of the first and second portions 932, 934 can be formed on an electrically conductive pad or portions of an electrically conductive trace disposed within the respective recesses 902, 904. In an exemplary embodiment, one or both of the first and second portions 932, 934 can be an electrically conductive pad or portions of an electrically conductive trace disposed at the respective major surface 912, 922. In a particular embodiment, one or both of the first and second substrates 910, 920 can contain active and/or passive devices (e.g., capacitors, resistors, etc.) therein. In some embodiments, mechanical or optical elements (e.g., an optical cover) may be disposed over one or both of the first and second substrates 910, 920. The formed conductive column 930 can be used to perform electrical functions (e.g., carry signals or a reference potential), mechanical functions (e.g., absorb mechanical stress between the first and second substrates) and/or thermal functions (e.g., heat transfer purposes).

Figure 11:
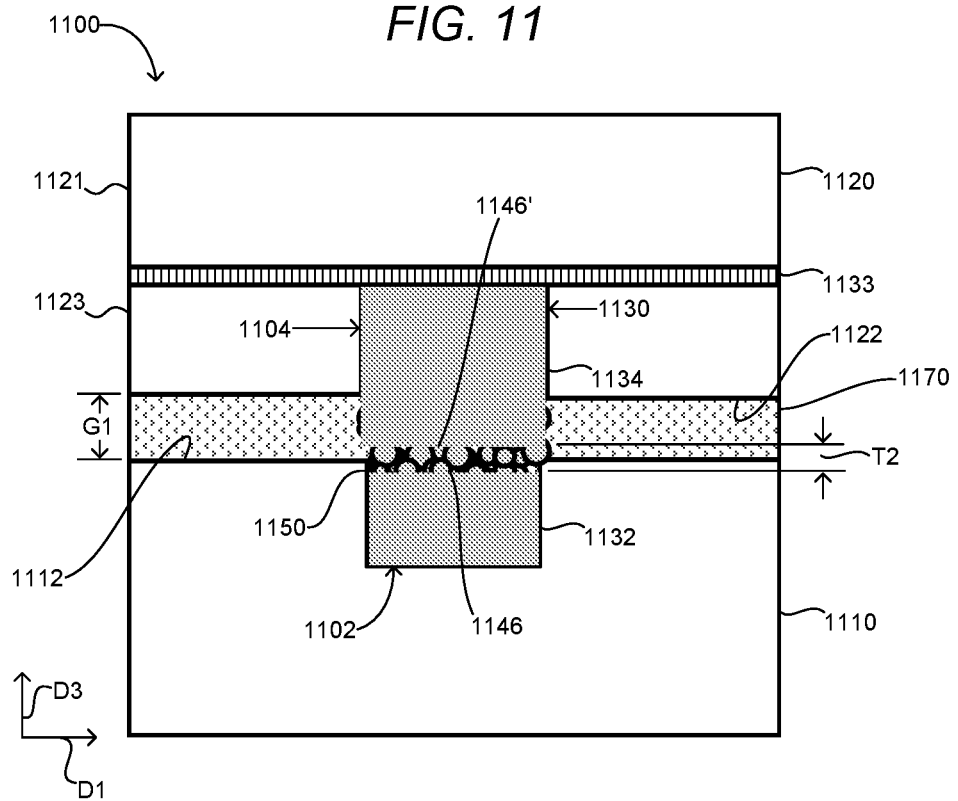
FIG. 11 is a diagrammatic side sectional view of an assembly according to an embodiment of the present invention.

FIG. 11 shows an assembly 1100 that is a variation of the assembly 900 shown and described above with reference to FIG. 9. The assembly 1100 is the same as the assembly 900 described above, except that the conductive structure 1130 has a second portion 1134 that is a metal post extending from a conductive element 1133 disposed below the major surface 1122, and the assembly has a dielectric region 1170 (e.g., an adhesive or an underfill) that is directly bonded to the major surfaces 1112 and 1122. The first substrate 1110 can be the same as the first substrate 910 described above.

The second portion 1134 can extend above the major surface 1122 in a direction opposite the third direction D3, and can include a substantially rigid element such as a vertically-extending portion of metal. The second portion 1134 can have a top surface 1146' that can project a height H1 (FIG. 12A) above the major surface 1122 such that the top surface is remote from the major surface. The second portion 1134 can define edge surfaces or sidewalls 1154 extending at substantial angles away from the top surface 1146.

In one example, the conductive element 1133 can be a layer including electrically conductive traces extending parallel to the major surface 1122, electrically conductive vias extending perpendicular to the major surface, and/or electrically conductive pads. In a particular embodiment, the substrate 1120 can include a first region 1121 and a second region 1123, and the conductive element 1133 can extend between the first and second regions. In one embodiment, the first region 1121 can comprise semiconductor material, and the second region 1123 can comprise a dielectric layer, e.g., a passivation layer such as silicon dioxide. The first region 1121 can have active semiconductor devices at or below the conductive element 1133. In embodiments where the first region 1121 comprises semiconductor material, the conductive element 1133 can be electrically insulated from the semiconductor material by a dielectric layer extending therebetween (not shown). As shown in FIG. 11, the top surface 1146' of the second portion 1134 does not extend into the recess 1102. However, in other embodiments (e.g., FIGS. 13-14B), the top surface of the second portion can extend from the second substrate into the recess below the major surface of the first substrate.

Figure 12A:
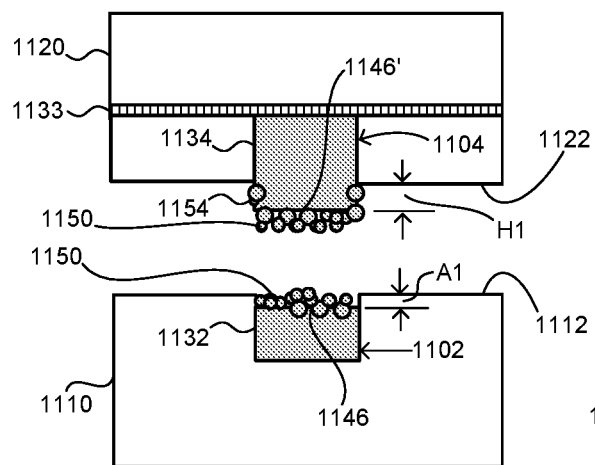
FIGS. 12A and 12B are side sectional views illustrating stages of fabrication in accordance with the embodiment depicted in FIG. 11.

A method of fabricating the assembly 1100 (FIG. 11) will now be described, with reference to FIGS. 12A-12B. The first portion 1132 can be formed in the same way as the first portion 932 described above. The second portion 1134 can be formed in a similar manner as any of the second portions 134/334/534/734 described above. In one example, the recess 1104 can be formed by etching at one or more locations along the major surface 1122 of the substrate 1120 until a top surface of the conductive element 1133 is exposed within the recess.

Next, nanoparticles 1150 can be deposited onto the first and second portions 1132, 1134, or alternatively, the nanoparticles may be applied only to one of the first and second portions and not to the other portion. For example, as shown in FIG. 12A, nanoparticles 1150 can be deposited onto the top surface 1146' and portions of the sidewalls 1154 of the second portion 1134 that extend above the major surface 1122. In one example, the nanoparticles 1150 can completely or substantially completely cover the top surface 1146 and the edge surfaces or sidewalls 1154 of the second portion 1132. Nanoparticles 1150 can also be deposited onto the top surface 1146 of the first portion 1132 within the recess 1102. The nanoparticles 1150 can be deposited using any of the methods described above with respect to depositing the nanoparticles 150/350/550/750/950.

Figure 12B:
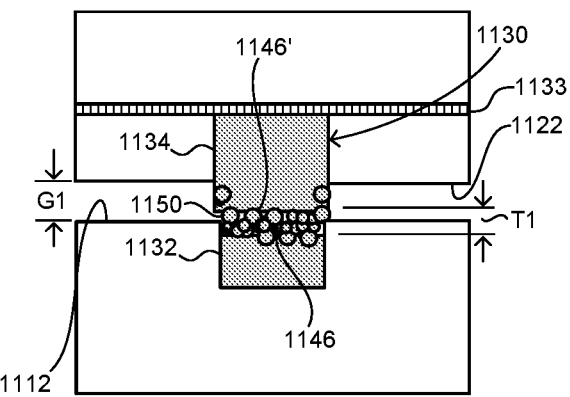

Then, as shown in FIG. 12B, the first portion 1132 disposed below the major surface 1112 of the first substrate 1110 may be joined with the second portion 1134 extending from the major surface 1122 of the second substrate 1120. To join the first portion 1132 and the second portion 1134 with one another, at least interfaces of the juxtaposed first and second portions of the assembly 1100 may be heated to a temperature that is close to the joining or sintering temperature. Then, the first portion 1132 and the second portion 1134 are juxtaposed with one another, and the first and second portions can be aligned with one another in the first and second lateral directions.

Next, the first portion 1132 and the second portion 1134 can be brought into contact with one another, such that the nanoparticles 1150 that were applied to one or both of the top surfaces 1146, 1146' of the respective first and second portions can then join together to form a layer having a thickness T1 in the third direction D3 by up to 3 microns, or between 0.02 microns and 3 microns, or between 0.05 and 3 microns, for example. Therefore, the nanoparticles 1150 can compensate for gaps between confronting corresponding top surfaces 1146, 1146' of the respective first and second portions 1132, 1134.

Then, at least interfaces of the juxtaposed first and second portions 1132, 1134 can be heated to a joining or sintering temperature, which preferably is below 200° C., more preferably below 180° C., or still more preferably below 150° C., at a relatively low pressure. During joining of the juxtaposed first and second portions 1132, 1134, an initial joining temperature can be below 100° C. before further heat processing at higher temperatures. At the joining temperature and sufficient pressure, the nanoparticles 1150 may diffuse into both the first portion 1132 and the second portion 1134, thereby forming a metallurgical joint and joining the first and second portions together into a conductive structure 1130, as can be seen in FIG. 11.

Next, as shown in FIG. 11, a dielectric region 1170 (e.g., an adhesive or an underfill) can be deposited between the major surface 1112 and 1122. The dielectric region 1170 can be directly bonded to the major surfaces 1112 and 1122. The dielectric region 1170 can fill the gap G1 that separates the major surfaces 1112 and 1122, so the dielectric region can have a thickness G1. The dielectric region 1170 can electrically insulate the conductive structures 1130 from one another, and the dielectric region can protect the conductive structures from moisture and/or other contaminants.

Figure 13:
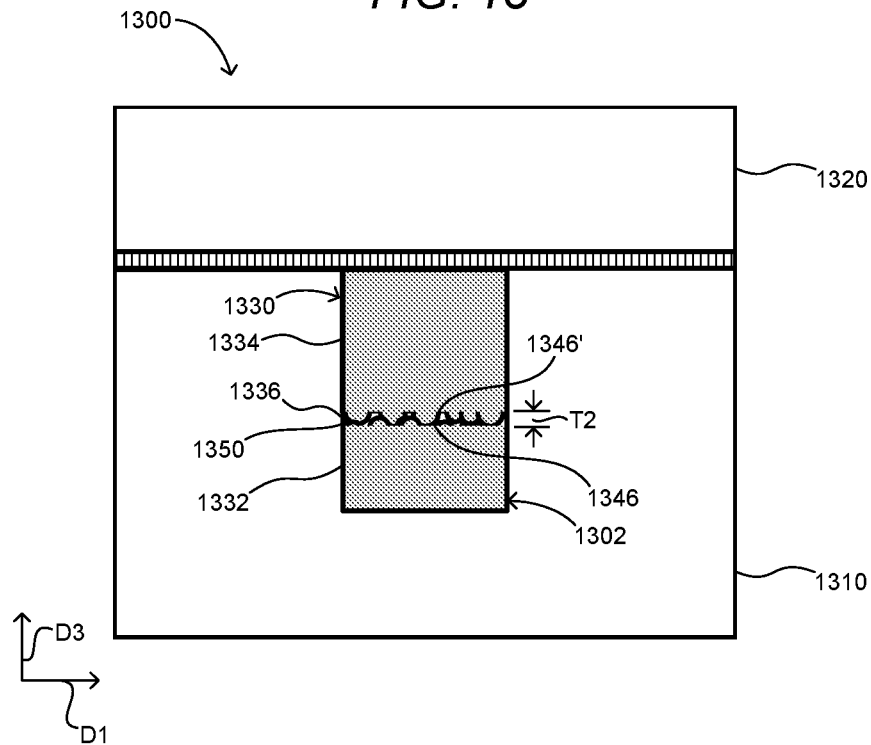
FIG. 13 is a diagrammatic side sectional view of an assembly according to an alternative embodiment of the assembly shown in FIG. 11.

FIG. 13 shows an assembly 1300 that is a variation of the assembly 1100 shown and described above with reference to FIG. 11. The assembly 1300 is the same as the assembly 1100 described above, except that the top surface 1346' of the second portion 1334 extends into the recess 1302, and the major surface 1312 can be directly bonded with the major surface 1322 without the use of an underfill.

The first substrate 1310 can be similar to the first substrate 1110 described above, although as can be seen in FIG. 13, the top surface 1346 of the first portion 1332 may be recessed by a distance A2 below the major surface, which may be greater than a distance A1 that the top surface of the first portion 1132 is recessed below the major surface 1112 shown in FIG. 11.

The second portion 1334 can extend above the major surface 1322 in a direction opposite the third direction D3, and can include a substantially rigid element such as a vertically-extending portion of metal. The second portion 1334 can have a top surface 1346' that can project a height H2 (FIG. 14A) above the major surface 1322 such that the top surface is remote from the major surface. The second portion 1334 can define edge surfaces or sidewalls 1354 extending at substantial angles away from the top surface 1346.

The height H2 that the top surface 1346' of the second portion 1334 projects above the major surface 1322 can be approximately equal to or less than the distance A2 that the top surface 1346 of the first portion 1332 is recessed below the major surface 1312, so that when the top surface 1346, 1346' are joined to one another, the major surface 1312 can be directly bonded with the major surface 1322 without the use of an underfill.

A method of fabricating the assembly 1300 (FIG. 13) will now be described, with reference to FIGS. 12A-12B. The first portion 1332 can be formed in the same way as the first portion 1132 described above. The second portion 1334 can be formed in a similar manner as any of the second portions 134/334/534/734 described above.

Figure 14A:
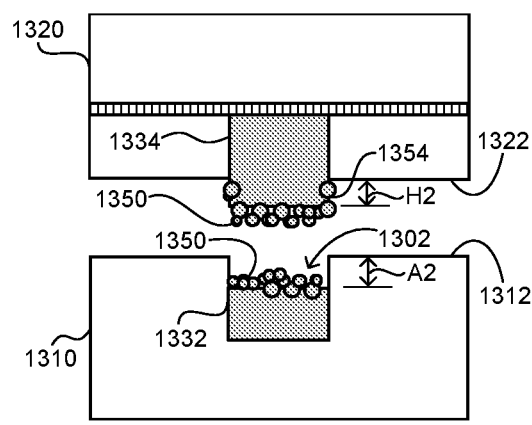
FIGS. 14A and 14B are side sectional views illustrating stages of fabrication in accordance with the embodiment depicted in FIG. 13.

Next, nanoparticles 1350 can be deposited onto the first and second portions 1332, 1334, or alternatively, the nanoparticles may be applied only to one of the first and second portions and not to the other portion. For example, as shown in FIG. 14A, nanoparticles 1350 can be deposited onto the top surface 1346' and portions of the sidewalls 1354 of the second portion 1334 that extend above the major surface 1322. In one example, the nanoparticles 1350 can completely or substantially completely cover the top surface 1346 and the edge surfaces or sidewalls 1354 of the second portion 1332. Nanoparticles 1350 can also be deposited onto the top surface 1346 of the first portion 1332 within the recess 1302. The nanoparticles 1350 can be deposited using any of the methods described above with respect to depositing the nanoparticles 150/350/550/750/950.

Figure 14B:
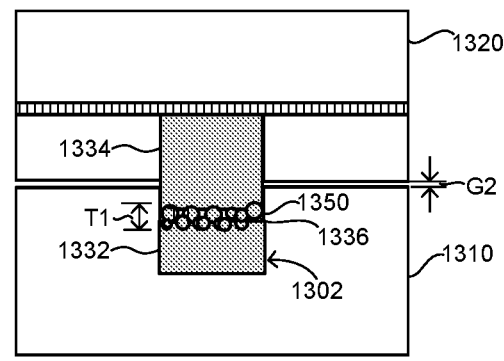

Then, as shown in FIG. 14B, the first portion 1332 disposed below the major surface 1312 of the first substrate 1310 may be joined with the second portion 1334 extending from the major surface 1322 of the second substrate 1320. To join the first portion 1332 and the second portion 1334 with one another, at least interfaces of the juxtaposed first and second portions of the assembly 1300 may be heated to a temperature that is close to the joining or sintering temperature. Then, the first portion 1332 and the second portion 1334 are juxtaposed with one another, and the first and second portions can be aligned with one another in the first and second lateral directions.

Next, the first portion 1332 and the second portion 1334 can be brought into contact with one another, such that the nanoparticles 1350 that were applied to one or both of the top surfaces 1346, 1346' of the respective first and second portions can then join together to form a layer having a thickness T1 in the third direction D3 by up to 3 microns, or between 0.02 microns and 3 microns, or between 0.05 and 3 microns, for example. Therefore, the nanoparticles 1350 can compensate for gaps between confronting corresponding top surfaces 1346, 1346' of the respective first and second portions 1332, 1334.

Then, at least interfaces of the juxtaposed first and second portions 1332, 1334 can be heated to a joining or sintering temperature, which preferably is below 200° C., more preferably below 180° C., or still more preferably below 150° C., at a relatively low pressure. During joining of the juxtaposed first and second portions 1332, 1334, an initial joining temperature can be below 100° C. before further heat processing at higher temperatures. At the joining temperature and sufficient pressure, the nanoparticles 1350 may diffuse into both the first portion 1332 and the second portion 1334, thereby forming a metallurgical joint and joining the first and second portions together into a conductive structure 1330, as can be seen in FIG. 13.

In one example, the major surfaces 1312 and 1322 can be juxtaposed with one another before the temperature of the devices is raised to a temperature at which the first and second portions 1332, 1334 are joined. The major surfaces 1312 and 1322 can comprise a dielectric adhesive material and/or a partially cured B-stage polymer material, such that before heating of the assembly 1300 or during heating of the assembly 1300, the major surfaces are directly bonded with one another. In a particular embodiment, the first and second substrates 1310, 1320 are juxtaposed with one another so that the major surfaces 1312, 1322 directly bond with one another, and such that the first portions 1332 confront the second portions 1334. This juxtaposing may be performed at an initial temperature, which may be room temperature or a relatively low temperature.

Then, after the major surfaces 1312, 1322 are bonded to one another, the assembly 1300 can be raised to a higher joining temperature so that the nanoparticles 1350 may diffuse into both the first portion 1332 and the second portion 1334, thereby forming a metallurgical joint and joining the first and second portions together into a conductive structure 1330. During the joining of the major surfaces 1312, 1322 and/or during joining of the first and second portions 1332, 1334, the assembly 1300 may also be subject to increased pressure.

After the major surfaces 1312, 1322 are bonded to one another and the first and second portions 1332, 1334 are bonded to one another, the thickness of the bond region 1336 in the third direction D3 may decrease from T1 (FIG. 14B) to T2 (FIG. 13), thereby bringing the confronting surfaces 1346, 1346' of the respective first and second portions 1332, 1334 closer to one another, as shown in FIG. 13. In a particular example, even after the thickness of the bond region 1336 decreases, the major surfaces 1312, 1322 may be separated by a gap G2, which may optionally be filled with a dielectric region such as an adhesive or underfill.

Figure 15:
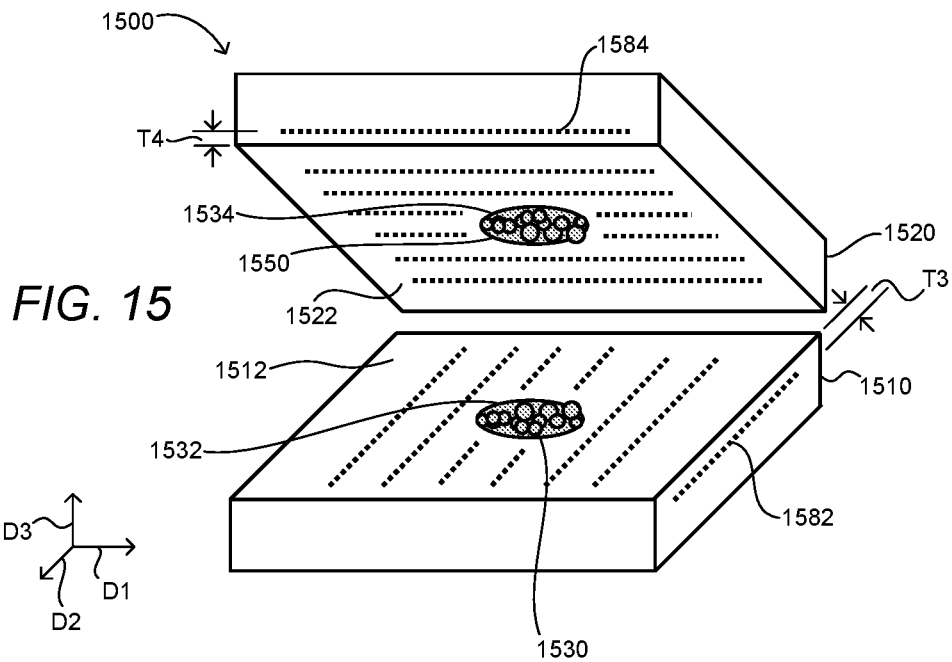
FIG. 15 is a diagrammatic perspective view of an assembly according to an embodiment of the present invention.

FIG. 15 shows an assembly 1500 that is a variation of the assembly 900 shown and described above with reference to FIG. 9. Although a variation of the assembly 900 is shown in FIG. 15, the features of the assembly 1500 can be added to any of the assemblies 100/300/500/700/900/1100/1300 described above.

The assembly 1500 is the same as the assembly 900 described above, except that the assembly 1500 includes metal elements 1582 and 1584 that are configured to provide electric shielding for the signals that may travel along the conductive structures 1530. FIG. 15 shows the first and second portions 1532, 1534 extending into recesses below the respective major surfaces 1512, 1522. The first and second portions 1532, 1534 can be joined by nanoparticles 1550 in the same way described above with reference to the assembly 900.

The first substrate 1510 has a plurality of metal elements that can be in the form of first traces 1582 extending in a second horizontal direction D2 parallel to the major surface 1512. As shown in FIG. 15, the first traces 1582 can be disposed in a plane parallel to the major surface 1512 at a distance T3 below the major surface. The first traces 1582 can extend in a plane across the first substrate 1510, with breaks in the pattern of traces to permit the first portions 1532 to extend between the first traces without contact between the first traces and the first portions.

The second substrate 1520 has a plurality of metal elements that can be in the form of second traces 1584 extending in a first horizontal direction D1 parallel to the major surface 1522. The second traces 1584 can be disposed in a plane parallel to the major surface 1522 at a distance T4 below the major surface. The second traces 1584 can extend in a plane across the second substrate 1520, with breaks in the pattern of traces to permit the second portions 1534 to extend between the second traces without contact between the second traces and the second portions.

The horizontal directions D2 and D1 in which the first and second traces 1582, 1584 extend can be transverse to one another. In one example, the horizontal directions D2 and D1 can be orthogonal to one another. Having first and second traces 1582, 1584 extending in the respective first and second substrates 1510, 1520 in directions transverse or orthogonal to one another can provide electric shielding for the signals that may travel along the conductive structures 1530, thereby potentially reducing crosstalk between different ones of the conductive structures 1530. In a particular embodiment, one or both of the first and second traces 1582, 1584 can be connected to a reference potential (i.e., electrical ground).

Figure 16:
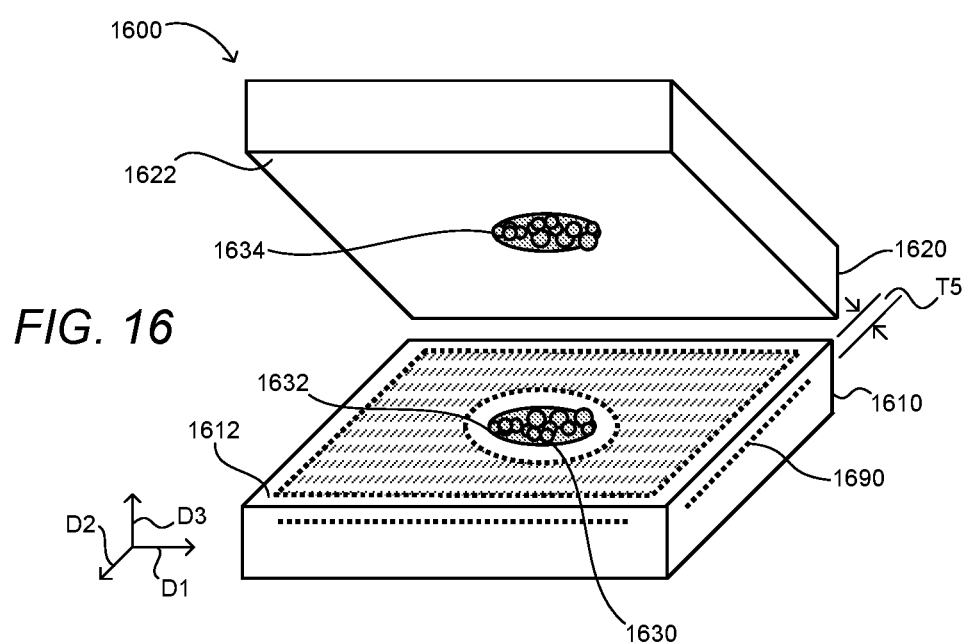
FIG. 16 is a diagrammatic perspective view of an assembly according to an alternative embodiment of the assembly shown in FIG. 15.

FIG. 16 shows an assembly 1600 that is a variation of the assembly 1500 shown and described above with reference to FIG. 15. The features of the assembly 1600 can be added to any of the assemblies 100/300/500/700/900/1100/1300 described above.

The assembly 1600 is the same as the assembly 1500 described above, except that the assembly 1600 includes metal element 1690 that is configured to provide electric shielding for the signals that may travel along the conductive structures 1630. FIG. 16 shows the first and second portions 1632, 1634 extending into recesses below the respective major surfaces 1612, 1622. The first and second portions 1632, 1634 can be joined by nanoparticles 1650 in the same way described above with reference to the assembly 900.

The first substrate 1610 has a metal element that can be in the form of metal sheet 1690 extending in first and second horizontal transverse directions D1, D2 parallel to the major surface 1612. As shown in FIG. 16, the metal sheet 1690 can be disposed in a plane parallel to the major surface 1612 at a distance T5 below the major surface. The metal sheet 1690 can extend in a plane across the first substrate 1610, with openings extending through the metal sheet in a vertical direction D3 perpendicular to the horizontal directions D1, D2 to permit the first portions 1632 to extend through the metal sheet without contact between the metal sheet and the first portions.

In a particular embodiment, the metal sheet 1690 can alternatively be disposed within the second substrate 1620 in a plane parallel to the major surface 1622 at a distance below the major surface. In such an embodiment, the metal sheet 1690 can extend in a plane across the second substrate 1620, with openings extending through the metal sheet in the vertical direction D3 to permit the second portions 1634 to extend through the metal sheet without contact between the metal sheet and the second portions.

Having the metal sheet 1690 extending in one of the respective first and second substrates 1610, 1620 in a plane parallel to the respective major surface 1612, 1622 can provide electric shielding for the signals that may travel along the conductive structures 1630, thereby potentially reducing crosstalk between different ones of the conductive structures 1630. In a particular embodiment, the metal sheet 1690 can be connected to a reference potential (i.e., electrical ground).

Although the assemblies 1500 and 1600 are shown as having first and second conductive portions 1532/1632 and 1534/1634 having round cross-sections, that need not be the case. For any of the assemblies described herein, the first and second conductive portions can have cross-sections having any shape. For example, one or both of the first and second conductive portions can have circular, oval, square, rectangular, or any other shapes. In one example, one or both of the first and second conductive portions can be disposed in an elongated groove or line exposed at the respective major surface, and/or one or both of the first and second conductive portions can be a solid metal post that is elongated in a horizontal direction parallel to the respective major surface. In a particular example, one or both of the first and second conductive portions can be disposed in a ring-shaped groove exposed at the respective major surface, and/or one or both of the first and second conductive portions can be a solid metal structure that forms a ring shape in the horizontal directions parallel to the respective major surface. In one example, the first and second conductive portions can be joined to form a metallic spacer for a MEMS compartment or other cavity.

Any of the assemblies 100, 300, 500, 700, 900, 1100, 1300, 1500, and 1600 described herein can be modified to include the nanoparticle variations described below. The conductive nanoparticles deposited onto a top surface of one or both of the first and second conductive portions can be made of one material or more than one material. In examples where the conductive nanoparticles deposited onto a top surface of one or both of the first and second conductive portions is made of more than one material, the conductive nanoparticles can include a plurality of layers of conductive particles overlying one or both of the top surfaces.

In one example, two layers of conductive nanoparticles can be deposited onto one or both of the first and second conductive portions. The two layers of conductive nanoparticles can include a first layer of conductive nanoparticles disposed directly onto the respective top surface, and a second layer of conductive nanoparticles disposed on the first layer of conductive nanoparticles. Such a second layer of conductive nanoparticles can comprise at least one material different than at least one material comprising the first layer of conductive nanoparticles. In one example, the first layer of conductive nanoparticles can include a barrier material such as nickel or an alloy including nickel, and the second layer of conductive nanoparticles can include tin or an alloy including tin (e.g., solder). In such an example, the first layer of conductive nanoparticles can be a barrier layer configured to prevent the second layer of conductive nanoparticles from forming an intermetallic with the metal of the first and/or second portion of the conductive column or structure.

In such an embodiment, after the first and second conductive portions are joined to create a conductive column or element, each bond region can include impurities that show structural evidence of first, second, and third layers of electrically conductive nanoparticles. The first and third layers of such a joined structure would be the first layer of conductive nanoparticles that was deposited onto the respective first and second conductive portions, and each of the first and third layers could include a barrier material such as nickel or an alloy including nickel. The second layer of such a joined structure would be the second layer of conductive nanoparticles that was deposited onto the respective first and second conductive portions, and such a second layer could include tin or an alloy including tin (e.g., solder).

In a particular example, where the conductive nanoparticles deposited onto a top surface of one or both of the first and second conductive portions is made of more than one material, the conductive nanoparticles can include three of layers of conductive particles overlying one or both of the top surfaces. The three layers of conductive nanoparticles can include a first layer of conductive nanoparticles disposed directly onto the respective top surface, a second layer of conductive nanoparticles disposed on the first layer of conductive nanoparticles, and a third layer of conductive nanoparticles disposed on the second layer of conductive nanoparticles.

Such a third layer of conductive nanoparticles can comprise at least one material different than at least one material comprising the second layer of conductive nanoparticles, and/or such a third layer of conductive nanoparticles can comprise at least one material different than at least one material comprising the first layer of conductive nanoparticles. In one example, the first layer of conductive nanoparticles can include a seed material such as copper, the second layer of conductive nanoparticles can include a barrier material such as nickel or an alloy including nickel, and the third layer of conductive nanoparticles can include tin or an alloy including tin (e.g., solder). In such an example, the second layer of conductive nanoparticles can be a barrier layer configured to prevent the third layer of conductive nanoparticles from forming an intermetallic with the material of the first layer of conductive nanoparticles and/or metal of the first and/or second portion of the conductive column or structure.

In such an embodiment, after the first and second conductive portions are joined to create a conductive column or element, each bond region can include impurities that show structural evidence of first, second, third, fourth, and fifth layers of electrically conductive nanoparticles. The first and fifth layers of such a joined structure would be the first layer of conductive nanoparticles that was deposited onto the respective first and second conductive portions, and each of the first and fifth layers could include a seed material such as copper. The second and fourth layers of such a joined structure would be the second layer of conductive nanoparticles that was deposited onto the respective first and second conductive portions, and such a second layer could include a barrier material such as nickel or an alloy including nickel. The third layer of such a joined structure would be the third layer of conductive nanoparticles that was deposited onto the respective first and second conductive portions, and such a third layer could include tin or an alloy including tin (e.g., solder).

In a variation of the embodiments described above, one or both of the first and second conductive portions can have a two-layer or three-layer joining structure disposed onto the top surface of the respective conductive portion. In such a variation, at least one of the metal layers in the joining structure can comprise nanoparticles. For example, a first metal layer (e.g., copper or another seed metal) can be disposed on the top surface of one or both of the first and second conductive portions, a second metal layer (e.g., nickel or another barrier metal) can be disposed on the first metal layer, and a third metal layer (e.g., tin or solder) can be disposed on the second metal layer. One, two, or all three of the first, second, and third metal layers can comprise nanoparticles.

In a particular embodiment, before the temperature of the assembly is elevated for joining of the first and second substrates, conductive nanoparticles can be deposited onto one or both of the first and second conductive portions, and a small amount of solder can be disposed onto the conductive nanoparticles on one or both of the first and second conductive portions. In such an example, when the temperature of the assembly is elevated for joining of the first and second conductive portions, the solder can fill gaps between at least some of the conductive nanoparticles via capillary action. Using solder in this way in addition to the conductive nanoparticles can better fill in gaps between the confronting first and second conductive portions, particularly if the top surfaces of one or both of the first and second conductive portions are non-planar.

The assemblies 100, 300, 500, 700, 900, 1100, 1300, 1500, and 1600 described herein can have some potential advantages compared to conventional assemblies. The nanoparticle layers described herein can compensate for a significant degree of non-planarity of the confronting top surfaces of the first and second conductive portions of the respective first and second substrates. For example, as described above, the layer of nanoparticles 150 can be compressed by different distances among different ones of the juxtaposed first and second portions, due to the non-planarity among the top surfaces of the first and second portions, so that the thickness of the resulting bond region 136 can vary by up to 3 microns so as to accommodate the non-coplanarity of the juxtaposed top surfaces of at least some of the first and second portions 132, 134. Such an ability to compensate for non-planarity of the confronting top surfaces may permit less expensive conductive element forming processes to be used that have a larger degree of non-planarity of the first and second conductive portions.

Another potential advantage of the assemblies 100, 300, 500, 700, 900, 1100, 1300, 1500, and 1600 described herein compared to conventional assemblies may be that the lower degree of warpage described above when joining first and second substrates as described herein with nanoparticles having a low joining or sintering temperature (e.g., below 200° C.) may permit use of first and second conductive portions with a smaller top surface area. Therefore, such first and second conductive portions with a smaller top surface area can form conductive columns that are thinner and more flexible, so assemblies having such thinner conductive columns can have better long-term reliability of the electrical connections between the first and second substrates after many repetitions of thermal cycling due to use of the assemblies over time.

Another potential advantage of the assemblies 100, 300, 500, 700, 900, 1100, 1300, 1500, and 1600 described herein compared to conventional assemblies may be that the minimum pitch between adjacent ones of the conductive columns or structures 130, 330, 530, 730, 930, 1130, or 1330 can be reduced. For example, the minimum pitch between adjacent ones of the conductive columns or structures 130, 330, 530, 730, 930, 1130, or 1330 can be 3-5 microns, compared to 20 microns in a conventional assembly.

Although the method steps of FIGS. 2A-2F, FIGS. 4A-4C, 6A-6D, 8A-8B, 10A-10C, 12A-12B, and 14A-14B were described above with reference to forming a single conductive column or structure 130/330/530/730/930/1130/1330 from a single first portion 132/332/532/732/932/1132/1332 and a single second portion 134/334/534/734/934/1134/1334, it is to be understood that the method steps described above can also be used to form a plurality of conductive columns or an m×n array of conductive columns from a plurality or an array of first portions extending from a single first substrate 110/310/510/710/910/1110/1310 and a plurality or an array of corresponding second portions extending from a single second substrate 120/320/520/720/920/1120/1320, one or both of m and n being greater than one.

The method steps of FIGS. 2A-2F, FIGS. 4A-4C, 6A-6D, 8A-8B, 10A-10C, 12A-12B, and 14A-14B described above can also be used to form pluralities or arrays of conductive columns or structures 130/330/530/730/930/1130/1330 on a plurality of sets of corresponding first and second substrates 110/310/510/710/910/1110/1310, 120/320/520/720/920/1120/1320, where the first substrates are initially part of a single first wafer, and the second substrates are initially part of a single second wafer, and the joined first and second wafers can be diced into individual assemblies 100/300/500/700/900/1100/1300 after joining of the corresponding first and second portions 132/332/532/732/932/1132/1332, 134/334/534/734/934/1134/1334.

For example, in one embodiment, a plurality of the first substrates are initially part of a single microelectronic element wafer including a plurality of microelectronic element portions, each microelectronic element portion including a respective subset of the first conductive portions at the respective major surface, and a plurality of the second substrates are initially part of a single substrate panel including a plurality of substrate portions, each substrate portion including a respective subset of the second conductive portions at the respective major surface.

In some of the embodiments disclosed herein, given the close spacing of the major surfaces of the first and second substrates from one another, it may not be possible to deposit underfill between adjacent ones of the joined conductive columns or structures. Underfill may not be needed in such an example, because the joined first and second conductive portions and the confronting major surfaces of the first and second substrates that may be touching each other can provide sufficient structural integrity of the joined assembly without using underfill.

Underfill may not be needed in regions where the local area density of the joined conductive columns or structures is at least 30%, which means that in a given plane extending through the conductive columns or structures and parallel to the major surfaces of the first and second substrates, at least 30% of the planar area is occupied by the conductive columns. If the local area density of the conductive columns is at least 30%, the conductive columns or structures can provide sufficient structural integrity to the joined assembly so that underfill is not needed. In one example, underfill may not be needed where the local area density of the conductive columns is at least 50%.

In such an embodiment not having underfill between adjacent ones of the conductive columns or structures, the first and second substrates can be sealed together with an overmold compound, and/or an outer peripheral boundary of the region having the joined conductive columns or structures can be sealed with a sealant such as a dielectric material like parylene or silicon dioxide, or with underfill, to keep moisture out of the region having the joined conductive columns or structures. However, such a sealant may only need to be applied around an outer peripheral boundary of the region having the joined conductive columns or structures, such that the sealant does not extend between adjacent ones of the joined conductive columns or structures.

Such an assembly of the first and second substrates that is joined together without underfill between adjacent ones of the joined conductive columns or structures can be more resistant to warping than it would be if underfill was used. Underfill may have a relatively high CTE (e.g., 15-25 ppm/° C.) compared to the material of the first and second substrates, so the use of underfill may warp the substrates when they undergo differential thermal expansion due to a temperature change. Without using underfill between adjacent ones of the joined conductive columns or structures, the joined assembly can be flatter and have a lower risk of warpage due to differential thermal expansion. This type of joining structure without underfill may, for example, be used for chip-to-wafer or wafer-to-wafer bonding.

Figure 17:
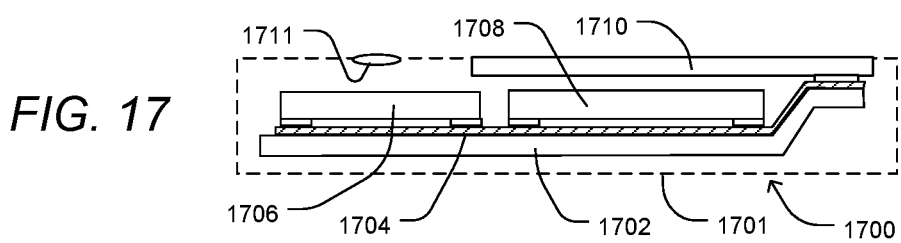
FIG. 17 is a schematic depiction of a system according to one embodiment of the invention.

The assemblies described above with reference to FIGS. 1-16 above can be utilized in construction of diverse electronic systems, such as the system 1700 shown in FIG. 17. For example, the system 1700 in accordance with a further embodiment of the invention includes a plurality of modules or components 1706 such as the assemblies as described above, in conjunction with other electronic components 1708, 1710 and 1711.

In the exemplary system 1700 shown, the system can include a circuit panel, motherboard, or riser panel 1702 such as a flexible printed circuit board, and the circuit panel can include numerous conductors 1704, of which only one is depicted in FIG. 17, interconnecting the modules or components 1706, 1708, 1710 with one another. Such a circuit panel 1702 can transport signals to and from each of the microelectronic packages and/or microelectronic assemblies included in the system 1700. However, this is merely exemplary; any suitable structure for making electrical connections between the modules or components 1706 can be used.

In a particular embodiment, the system 1700 can also include a processor such as the semiconductor chip 1708, such that each module or component 1706 can be configured to transfer a number N of data bits in parallel in a clock cycle, and the processor can be configured to transfer a number M of data bits in parallel in a clock cycle, M being greater than or equal to N.

In the example depicted in FIG. 17, the component 1708 is a semiconductor chip and component 1710 is a display screen, but any other components can be used in the system 1700. Of course, although only two additional components 1708 and 1711 are depicted in FIG. 17 for clarity of illustration, the system 1700 can include any number of such components.

Modules or components 1706 and components 1708 and 1711 can be mounted in a common housing 1701, schematically depicted in broken lines, and can be electrically interconnected with one another as necessary to form the desired circuit. The housing 1701 is depicted as a portable housing of the type usable, for example, in a cellular telephone or personal digital assistant, and screen 1710 can be exposed at the surface of the housing. In embodiments where a structure 1706 includes a light-sensitive element such as an imaging chip, a lens 1711 or other optical device also can be provided for routing light to the structure. Again, the simplified system shown in FIG. 17 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

What is claimed is:

1. A bonded structure, comprising:
   a first component including a substrate having a first dielectric surface and a first conductive feature at the first dielectric surface, the first conductive feature comprising a first barrier layer thereover; and
   a second component including a substrate having a second dielectric surface and a second conductive feature at the second dielectric surface, the second conductive feature comprising a second barrier layer thereover, wherein:
   the first dielectric surface is directly bonded to the second dielectric surface without an underfill, and
   the first conductive feature is bonded to second conductive feature by way of a conductive bond region between the first and second barrier layers, the conductive bond region comprising a different material from the first and second barrier layers, wherein the bond region comprises structural evidence of conductive nanoparticles employed in bonding the first conductive feature to the second conductive feature, and the side surfaces of the bond region are more rough than side surfaces of the first and second conductive features.

2. The structure of claim 1, wherein the first conductive feature and the second conductive feature each comprise copper.

3. The structure of claim 1, further comprising microvoids within the bond region, wherein the microvoids have a maximum width below 0.5 micron.

4. The structure of claim 1, wherein the bond region comprises copper.

5. The structure of claim 1, wherein the bond region comprises at least one metal selected from the group consisting of copper, gold, nickel, silver and a combination of metals, and the bond region comprises structural evidence of conductive nanoparticles employed in bonding the first conductive feature to the second conductive feature.

6. The structure of claim 1, wherein the barrier layers each comprise a barrier metal.

7. The structure of claim 6, wherein the barrier metal comprises a nickel or a nickel alloy.

8. A first electronic element configured for directly bonding with a second electronic element, the first electronic element comprising:
   a substrate having a first dielectric surface configured to directly bond with a second dielectric surface of the second electronic element;
   a conductive feature at the dielectric surface;
   a barrier layer over the conductive feature; and
   a conductive nanoparticle layer over the barrier layer such that the barrier layer is between the conductive feature and the conductive nanoparticle layer, the conductive nanoparticle layer configured to directly bond with a second conductive feature at the second dielectric surface of the second electronic element.

9. The electronic element of claim 8, wherein the conductive feature is recessed below the dielectric surface.

10. The electronic element of claim 9, wherein the conductive feature comprises copper.

11. The electronic element of claim 9, wherein the barrier layer comprises a barrier metal.

12. The electronic element of claim 8, wherein conductive nanoparticles of the conductive particle layer have long dimensions smaller than 100 nm.

13. The electronic element of claim 8, further comprising an array of the conductive feature, each of the conductive features being recessed below the dielectric surface and including the barrier layer and the conductive nanoparticle layer thereover.

14. The electronic element of claim 8, wherein the barrier layer comprises a layer of nanoparticles.

15. A first electronic element configured for directly bonding with a second electronic element, the first electronic element comprising:
   a substrate having a first dielectric surface structured for directly bonding with a second dielectric surface of the second electronic element;
   a conductive feature at the first dielectric surface; and
   a conductive nanoparticle layer for directly bonding with a second conductive feature at the second dielectric surface of the second electronic element, wherein nanoparticles of the nanoparticle layer are smaller than grains of the conductive feature.

16. The electronic element of claim 15, further comprising a barrier layer between the conductive feature and the conductive nanoparticle layer.

17. The electronic element of claim 16, wherein the barrier layer lines a recess between an upper surface of the conductive feature and the first dielectric surface.

* * * * *